US011407857B2

(12) United States Patent
Nakayama et al.

(10) Patent No.: US 11,407,857 B2
(45) Date of Patent: Aug. 9, 2022

(54) METHOD FOR PRODUCING AQUEOUS POLYIMIDE PRECURSOR SOLUTION COMPOSITION

(71) Applicant: UBE INDUSTRIES, LTD., Ube (JP)

(72) Inventors: Takeshige Nakayama, Ube (JP); Susumu Takasaki, Ube (JP); Tomonori Nakayama, Ube (JP); Kensuke Hiroshige, Ube (JP)

(73) Assignee: Ube Industries, Ltd., Ube (JP)

( * ) Notice: Subject to any disclaimer, the term of this patent is extended or adjusted under 35 U.S.C. 154(b) by 1 day.

(21) Appl. No.: 16/832,378

(22) Filed: Mar. 27, 2020

(65) Prior Publication Data

US 2020/0224054 A1 Jul. 16, 2020

Related U.S. Application Data

(62) Division of application No. 15/342,655, filed on Nov. 3, 2016, now abandoned, which is a division of application No. 14/343,745, filed as application No. PCT/JP2012/072798 on Sep. 6, 2012, now abandoned.

(30) Foreign Application Priority Data

Sep. 9, 2011 (JP) ................................. 2011-197581
Jan. 13, 2012 (JP) ................................. 2012-005685

(51) Int. Cl.
| | | |
|---|---|---|
| *C08G 73/10* | (2006.01) | |
| *C08L 79/08* | (2006.01) | |
| *C09D 179/08* | (2006.01) | |
| *H01M 4/62* | (2006.01) | |
| *H05K 1/02* | (2006.01) | |
| *H05K 3/00* | (2006.01) | |
| *C08G 73/12* | (2006.01) | |
| *H01M 4/04* | (2006.01) | |
| *H01M 10/0525* | (2010.01) | |
| *G02F 1/1333* | (2006.01) | |

(52) U.S. Cl.
CPC ....... *C08G 73/1021* (2013.01); *C08G 73/105* (2013.01); *C08G 73/1032* (2013.01); *C08G 73/1046* (2013.01); *C08G 73/1071* (2013.01); *C08G 73/1078* (2013.01); *C08G 73/1082* (2013.01); *C08G 73/128* (2013.01); *C08L 79/08* (2013.01); *C09D 179/08* (2013.01); *H01M 4/0404* (2013.01); *H01M 4/0471* (2013.01); *H01M 4/622* (2013.01); *H01M 4/623* (2013.01); *H01M 10/0525* (2013.01); *H05K 1/028* (2013.01); *H05K 3/007* (2013.01); *C09D 179/085* (2013.01); *G02F 1/133305* (2013.01)

(58) Field of Classification Search
None
See application file for complete search history.

(56) References Cited

U.S. PATENT DOCUMENTS

| | | | | |
|---|---|---|---|---|
| 3,440,197 A | * | 4/1969 | Boldebuck | ............. C08G 73/00 |
| | | | | 524/714 |
| 3,507,765 A | * | 4/1970 | Holub | ................ C08G 73/1071 |
| | | | | 204/492 |
| 3,575,923 A | * | 4/1971 | Jones | .................. C08G 73/1028 |
| | | | | 528/229 |
| 3,703,493 A | | 11/1972 | Holub | |
| 4,221,897 A | * | 9/1980 | Takekoshi | .......... C08G 73/1007 |
| | | | | 528/125 |
| 4,470,944 A | | 9/1984 | Asakura | |
| 4,480,088 A | | 10/1984 | Pike | |
| 2002/0151234 A1 | | 10/2002 | Ozawa et al. | |
| 2013/0171520 A1 | | 7/2013 | Nakayama et al. | |
| 2014/0218875 A1 | * | 8/2014 | Nakayama | ............ C08G 73/128 |
| | | | | 361/751 |

FOREIGN PATENT DOCUMENTS

| | | | | |
|---|---|---|---|---|
| GB | 1162203 A | 8/1969 | | |
| JP | H07-302969 A | 11/1995 | | |
| JP | H08-059832 A | 3/1996 | | |
| JP | 2000-297152 A | 10/2000 | | |
| JP | 2002-226582 A | 8/2002 | | |
| JP | 2003-013351 A | 1/2003 | | |
| JP | 2006-232911 A | 9/2006 | | |
| JP | 2008-050611 A | 3/2008 | | |
| JP | 2010-202729 A | 9/2010 | | |
| WO | WO-2011154132 A1 * | 12/2011 | ......... C08G 73/1042 | |
| WO | WO 2012/008543 A1 | 1/2012 | | |

OTHER PUBLICATIONS

Chemical Abstracts (solubility data for Benzenamine, 4,4'-[1,3-phenylenebis(oxy)]bis-, 2479-46-1, downloaded Aug. 24, 2015).
Hitachi Chemical Technical Report No. 45, (Jul. 2005).
Seo, et al., Effect of hydrophobic u hexafluoroisopropylidene group on the water sorption behaviors of rigid poly(p-phenylene pyromellitimide) polyimide thin films, Journal of Applied Polymer Science, vol. 89, 3442-3446 (2003) (Year: 2003).
Yoshida et al., "Compositional change of mixed alkyl carbonate electrolyte in lithium battery," The 35th Battery Symposium in Japan, pp. 75-76, (Nov. 14, 1994).
International Preliminary Report on Patentability dated Mar. 20, 2014 in International Application No. PCT/JP2012/072798.

* cited by examiner

*Primary Examiner* — Rachel Kahn
(74) *Attorney, Agent, or Firm* — Knobbe, Martens, Olson & Bear, LLP

(57) ABSTRACT

A method for producing an aqueous polyimide precursor solution composition includes forming a polyamic acid by the reaction of a tetracarboxylic acid component and a diamine component in an aqueous solvent together with an imidazole in an amount of 1.6 mole or more per mole of the tetracarboxylic acid component of the polyamic acid.

6 Claims, No Drawings

METHOD FOR PRODUCING AQUEOUS POLYIMIDE PRECURSOR SOLUTION COMPOSITION

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 CFR 1.57.

BACKGROUND OF THE INVENTION

Field of the Invention

The present invention relates to an aqueous polyimide precursor solution composition and a method for easily producing an aqueous polyimide precursor solution composition. The aqueous polyimide precursor solution composition is preferred because of having high environmental acceptability as compared with a polyimide precursor solution composition comprising an organic solvent. The production method of the present invention does not require any solvent other than water, and therefore it may provide an aqueous polyimide precursor solution composition having a lower content of organic solvent than the conventional compositions, and may provide an aqueous polyimide precursor solution composition containing an aqueous solvent and containing no organic solvent, which has higher environmental acceptability. In addition, a polyimide may be suitably obtained from the aqueous polyimide precursor solution composition. A polyimide obtained from a specific aqueous polyimide precursor solution composition of the present invention, in particular, has excellent properties such as heat resistance, mechanical strength, electrical properties, and solvent resistance, and further has excellent flexibility.

The present invention also relates to a method for producing a polyimide seamless belt using the aqueous polyimide precursor solution composition. The present invention also relates to a binder resin composition (aqueous polyimide precursor solution composition for a binder resin) for an electrode of an electrochemical device such as a lithium ion secondary battery and an electric double layer capacitor. The present invention also relates to an aqueous polyimide precursor solution composition for a flexible device substrate, for example, an aqueous polyimide precursor solution composition for a substrate of a display device such as a liquid crystal display, an organic EL display and an electronic paper, and a light-receiving device such as a light-receiving element of a thin-film solar cell.

Description of the Related Art

A polyimide obtained from a tetracarboxylic dianhydride and a diamine, particularly an aromatic polyimide obtained from an aromatic tetracarboxylic dianhydride and an aromatic diamine has excellent properties such as heat resistance, mechanical strength, electrical properties, and solvent resistance, and therefore is widely used in the electrical/ electronics industrial field and the like. Because polyimides have poor solubility in organic solvents, however, polyimides are generally prepared by applying a solution composition in which a polyamic acid as a polyimide precursor is dissolved in an organic solvent, for example, onto a substrate surface, and then heating the solution composition at a high temperature to effect dehydration/ring closure (imidization). The polyamic acid solution composition to produce a polyimide contains an organic solvent and must be subjected to heat treatment at a high temperature, and therefore the polyamic acid solution composition is not necessarily environmentally friendly and in some cases, its application is limited.

Additionally, as described above, an aromatic polyimide obtained from an aromatic tetracarboxylic dianhydride and an aromatic diamine has excellent heat resistance, mechanical strength and the like, and therefore is widely used in the electrical/electronics industrial field and the like. In the meantime, there is a need for a polyimide further having excellent flexibility, for example, in the binder application, flexible-device application and the like.

As for a water-soluble polyimide precursor, Patent Literature 1, for example, proposes a process for producing an aqueous polyamide acid salt solution composition, comprising polymerizing a tetracarboxylic dianhydride and a diamine in an organic solvent, to provide a polyamide acid;

optionally hydrolyzing the polyamide acid, as necessary;

pouring the resulting varnish into water, to pulverize the polyamide acid and to extract and remove a reaction solvent contained in the polyamide acid;

drying the polyamide acid; and reacting the polyamide acid in water with a certain amine compound such as 2-methylamino diethanol to form a water-soluble polyamide acid salt. However, it is difficult to form a high molecular weight polymer from this aqueous polyamide acid salt solution composition (polyimide precursor composition) and it is also desirable to further improve the properties of the polyimide obtained.

Patent Literature 2 proposes a water-soluble polyimide precursor prepared by reacting a polyamic acid (polyimide precursor), which is prepared by reacting a tetracarboxylic acid component with an aromatic diamine component in an organic solvent, with 1,2-dimethylimidazole and/or 1-methyl-2-ethylimidazole, and then separating the water-soluble polyimide precursor from the reaction mixture. The water-soluble polyimide precursors prepared in Examples of Patent Literature 2, however, were ones from which only amorphous aromatic polyimides could be obtained.

Although a polyimide which is obtained from the water-soluble polyimide precursor prepared in Patent Literature 2 is amorphous and thermal-fusion bondable, and is suitably used as a binder for a woven or nonwoven fabric made of organic or inorganic fibers, there is room for improvement in the properties of the polyimide in some applications. Additionally, the aqueous polyimide precursor solution composition is prepared by a process, comprising preparing a water-soluble polyimide precursor in an organic solvent;

separating the water-soluble polyimide precursor therefrom; and dissolving the separated water-soluble polyimide precursor in an aqueous solvent.

Thus, extremely complicated operations are needed. Moreover, an organic solvent cannot be completely removed from a water-soluble polyimide precursor prepared in the organic solvent. (If the water-soluble polyimide precursor is heated so as to completely remove the organic solvent, imidization occurs, and therefore the polyimide precursor loses solubility in water.) For this reason, the aqueous polyimide precursor solution composition obtained will inevitably contain an organic solvent.

Meanwhile, Non Patent Literature 1 shows that a binder resin for electrodes having a lower degree of swelling in a liquid electrolyte is preferred, because the retention of discharge capacity in charge-discharge cycles increases with the decrease in the degree of swelling of the binder resin.

In Non Patent Literature 2, a reductive decomposition reaction of a liquid electrolyte in a lithium battery is analyzed, and it is confirmed that lithium methoxide and the like are formed on a surface of an electrode. That is, in a battery environment, a liquid electrolyte will contain lithium methoxide, which is strongly alkaline and may adversely affect a binder resin.

In addition, Patent Literature 3 proposes a method for producing a flexible device substrate, using a polyimide precursor resin composition which comprises an organic solvent, specifically, N-methyl-2-pyrrolidone, N,N-dimethylformamide, N,N-dimethylacetamide, or the like as a solvent. In the meantime, from the point of view of environmental acceptability, there is a need for a composition comprising an aqueous solvent, as described above.

CITATION LIST

Patent Literature

Patent Literature 1: JP-A-H08-59832
Patent Literature 2: JP-A-2002-226582
Patent Literature 3: JP-A-2010-202729

Non Patent Literature

Non Patent Literature 1: Technical Report of Hitachi Chemical Company, Ltd., No. 45 (July of 2005)
Non Patent Literature 2: Hiroaki YOSHIDA et al., "Decomposition Reaction of Liquid Electrolyte comprising Carbonate in Lithium Battery", The 35th Battery Symposium Abstract Book, p. 75-76, Japan, ed. The Electrochemical Society of Japan, The Committee of Battery Technology (Nov. 14, 1994)

SUMMARY OF THE INVENTION

Problems to be Solved by the Invention

The first objective of the present invention is to provide an aqueous polyimide precursor solution composition which comprises an aqueous solvent and has good environmental acceptability, and may provide a polyimide having excellent properties such as flexibility, heat resistance, mechanical strength, electrical properties, and solvent resistance, and preferably comprises a polyimide precursor (polyamic acid) having a high molecular weight and a solvent containing no organic solvent other than water. Another objective of the present invention is to provide a method for easily producing the aqueous polyimide precursor solution composition without the need for a solvent other than water.

The second objective of the present invention is to provide a method for producing a polyimide seamless belt which have excellent properties such as flexibility, heat resistance, mechanical strength, electrical properties, and solvent resistance, and therefore may be suitably used as an intermediate transfer seamless belt or a fixing seamless belt of an electrophotographic device, using an aqueous polyimide precursor solution composition which comprises an aqueous solvent and has good environmental acceptability.

The third objective of the present invention is to provide a binder resin composition for electrodes which comprises an aqueous solvent and has good environmental acceptability, and may provide a polyimide having excellent properties such as flexibility, heat resistance, mechanical strength, electrical properties, and solvent resistance, and furthermore having a low degree of swelling in a battery environment, and having excellent toughness, and preferably comprises a polyimide precursor (polyamic acid) having a high molecular weight and a solvent containing no organic solvent other than water.

The fourth objective of the present invention is to provide a polyimide precursor resin composition for flexible device substrates which comprises an aqueous solvent and has good environmental acceptability, and may provide a polyimide substrate for flexible device having excellent properties such as flexibility, heat resistance, mechanical strength, electrical properties, and solvent resistance, and being suitably usable as a substrate for flexible device as a display device such as substrates for a liquid crystal display, an organic EL display and an electronic paper, a substrate for flexible device as a light-receiving device such as a substrate for a thin-film solar cell, and the like, and preferably comprises a polyimide precursor (polyamic acid) having a high molecular weight and a solvent containing no organic solvent other than water.

Means for Solving the Problems

The present invention relates to the following items.

[1] An aqueous polyimide precursor solution composition, wherein a polyamic acid, which is formed by the reaction of a tetracarboxylic acid component and a diamine component, and consists of a repeating unit represented by the following formula (1), is dissolved in an aqueous solvent together with an imidazole in an amount of 1.6 mole or more per mole of the tetracarboxylic acid component of the polyamic acid.

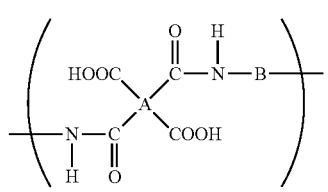

Formula (1)

wherein

A represents at least one selected from the group consisting of a tetravalent group of an aromatic tetracarboxylic acid containing no fluorine group, from which carboxyl groups have been removed, a tetravalent group of an aliphatic tetracarboxylic acid, from which carboxyl groups have been removed, and a tetravalent group of an aromatic tetracarboxylic acid containing a fluorine group, from which carboxyl groups have been removed, and B represents at least one selected from the group consisting of a divalent group of an aromatic diamine containing no fluorine group and having a solubility in water at 25° C. of 0.1 g/L or more, from which amino groups have been removed, a divalent group of an aliphatic diamine having a molecular weight of 500 or less, from which amino groups have been removed, and a divalent group of an aromatic diamine containing a fluorine group, from which amino groups have been removed, with the proviso that more than 50 mol % of A is a tetravalent group of an aromatic tetracarboxylic acid containing no fluorine group, from which carboxyl groups have been removed, and less than 50 mol %, including 0 mol %, of A is a tetravalent group of an aliphatic tetracarboxylic acid, from which carboxyl groups have been removed, and/or a tetravalent group of an aromatic tetracarboxylic acid containing a fluorine group, from which carboxyl groups have been removed, and more than 50 mol % of B is a divalent group of an aromatic diamine containing no fluorine group and having a solubility in water at 25° C. of 0.1 g/L or more, from which amino groups have been removed, and less than 50 mol %, including 0 mol %, of B is a divalent group of an aliphatic diamine having a molecular weight of 500 or less, from which amino groups have been removed, and/or a divalent group of an aromatic diamine containing a fluorine group, from which amino groups have been removed, and a combination of only a tetravalent group (A) of an aromatic tetracarboxylic acid containing no fluorine group, from which carboxyl groups have been removed, and only a divalent group (B) of an aromatic diamine containing no fluorine group, from which amino groups have been removed, is excluded.

[2] The aqueous polyimide precursor solution composition as described in [1], wherein the imidazole is selected from the group consisting of 1,2-dimethylimidazole, 2-ethyl-4-methylimidazole, 4-ethyl-2-methylimidazole, and 1-methyl-4-ethylimidazole.

[3] The aqueous polyimide precursor solution composition as described in [1] or [2], wherein the aqueous polyimide precursor solution composition has an inherent viscosity of 0.2 or more.

[4] The aqueous polyimide precursor solution composition as described in any one of [1] to [3], wherein the aqueous polyimide precursor solution composition has an organic solvent content of less than 5 wt %.

[5] The aqueous polyimide precursor solution composition as described in [4], wherein the aqueous polyimide precursor solution composition contains substantially no organic solvent.

[6] A method for producing a polyimide seamless belt, comprising a step of:

heating an aqueous polyimide precursor solution composition, in which a polyamic acid, which is formed by the reaction of a tetracarboxylic acid component and a diamine component, and consists of a repeating unit represented by the following formula (1), is dissolved in an aqueous solvent together with an imidazole in an amount of 1.6 mole or more per mole of the tetracarboxylic acid component of the polyamic acid.

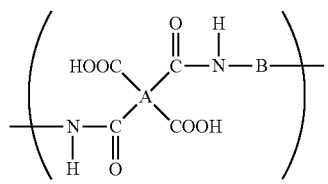

Formula (1)

wherein

A represents at least one selected from the group consisting of a tetravalent group of an aromatic tetracarboxylic acid containing no fluorine group, from which carboxyl groups have been removed, a tetravalent group of an aliphatic tetracarboxylic acid, from which carboxyl groups have been removed, and a tetravalent group of an aromatic tetracarboxylic acid containing a fluorine group, from which carboxyl groups have been removed, and B represents at least one selected from the group consisting of a divalent group of an aromatic diamine containing no fluorine group and having a solubility in water at 25° C. of 0.1 g/L or more, from which amino groups have been removed, a divalent group of an aliphatic diamine having a molecular weight of 500 or less, from which amino groups have been removed, and a divalent group of an aromatic diamine containing a fluorine group, from which amino groups have been removed, with the proviso that more than 50 mol % of A is a tetravalent group of an aromatic tetracarboxylic acid containing no fluorine group, from which carboxyl groups have been removed, and less than 50 mol %, including 0 mol %, of A is a tetravalent group of an aliphatic tetracarboxylic acid, from which carboxyl groups have been removed, and/or a tetravalent group of an aromatic tetracarboxylic acid containing a fluorine group, from which carboxyl groups have been removed, and more than 50 mol % of B is a divalent group of an aromatic diamine containing no fluorine group and having a solubility in water at 25° C. of 0.1 g/L or more, from which amino groups have been removed, and less than 50 mol %, including 0 mol %, of B is a divalent group of an aliphatic diamine having a molecular weight of 500 or less, from which amino groups have been removed, and/or a divalent group of an aromatic diamine containing a fluorine group, from which amino groups have been removed, and a combination of only a tetravalent group (A) of an aromatic tetracarboxylic acid containing no fluorine group, from which carboxyl groups have been removed, and only a divalent group (B) of an aromatic diamine containing no fluorine group, from which amino groups have been removed, is excluded.

[7] A binder resin composition for electrodes, wherein a polyamic acid, which is formed by the reaction of a tetracarboxylic acid component and a diamine component, and consists of a repeating unit represented by the following formula (1), is dissolved in an aqueous solvent together with an imidazole in an amount of 1.6 mole or more per mole of the tetracarboxylic acid component of the polyamic acid.

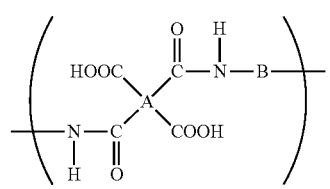

Formula (1)

wherein

A represents at least one selected from the group consisting of a tetravalent group of an aromatic tetracarboxylic acid containing no fluorine group, from which carboxyl groups have been removed, a tetravalent group of an aliphatic tetracarboxylic acid, from which carboxyl groups have been removed, and a tetravalent group of an aromatic tetracarboxylic acid containing a fluorine group, from which carboxyl groups have been removed, and B represents at least one selected from the group consisting of a divalent group of an aromatic diamine containing no fluorine group and having a solubility in water at 25° C. of 0.1 g/L or more, from which amino groups have been removed, a divalent group of an aliphatic diamine having a molecular weight of 500 or less, from which amino groups have been removed, and a divalent group of an aromatic diamine containing a fluorine group, from which amino groups have been removed, with the proviso that more than 50 mol % of A is a tetravalent group of an aromatic tetracarboxylic acid containing no fluorine group, from which carboxyl groups have been removed, and less than 50 mol %, including 0 mol %, of A is a tetravalent group of an aliphatic tetracarboxylic acid, from which carboxyl groups have been removed, and/or a tetravalent group of an aromatic tetracarboxylic acid containing a fluorine group, from which carboxyl groups have been removed, and more than 50 mol % of B is a divalent group of an aromatic diamine containing no fluorine group and having a solubility in water at 25° C. of 0.1 g/L or more, from which amino groups have been removed, and less than 50 mol %, including 0 mol %, of B is a divalent group of an aliphatic diamine having a molecular weight of 500 or less, from which amino groups have been removed, and/or a divalent group of an aromatic diamine containing a fluorine group, from which amino groups have been removed, and a combination of only a tetravalent group (A) of an aromatic tetracarboxylic acid containing no fluorine group, from which carboxyl groups have been removed, and only a divalent group (B) of an aromatic diamine containing no fluorine group, from which amino groups have been removed, is excluded.

[8] An electrode mixture paste comprising an electrode active material and a binder resin composition for electrodes as described in [7].

[9] An electrode produced by applying an electrode mixture paste as described in [8] onto a current collector, and then heating the electrode mixture paste to remove a solvent and effect imidization.

[10] A polyimide precursor resin composition for flexible device substrates, wherein a polyamic acid, which is formed by the reaction of a tetracarboxylic acid component and a diamine component, and consists of a repeating unit represented by the following formula (1), is dissolved in an aqueous solvent together with an imidazole in an amount of 1.6 mole or more per mole of the tetracarboxylic acid component of the polyamic acid.

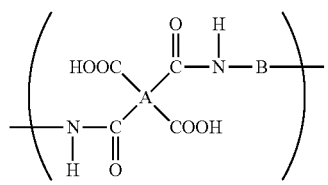

Formula (1)

wherein

A represents at least one selected from the group consisting of a tetravalent group of an aromatic tetracarboxylic acid containing no fluorine group, from which carboxyl groups have been removed, a tetravalent group of an aliphatic tetracarboxylic acid, from which carboxyl groups have been removed, and a tetravalent group of an aromatic tetracarboxylic acid containing a fluorine group, from which carboxyl groups have been removed, and B represents at least one selected from the group consisting of a divalent group of an aromatic diamine containing no fluorine group and having a solubility in water at 25° C. of 0.1 g/L or more, from which amino groups have been removed, a divalent group of an aliphatic diamine having a molecular weight of 500 or less, from which amino groups have been removed, and a divalent group of an aromatic diamine containing a fluorine group, from which amino groups have been removed, with the proviso that more than 50 mol % of A is a tetravalent group of an aromatic tetracarboxylic acid containing no fluorine group, from which carboxyl groups have been removed, and less than 50 mol %, including 0 mol %, of A is a tetravalent group of an aliphatic tetracarboxylic acid, from which carboxyl groups have been removed, and/or a tetravalent group of an aromatic tetracarboxylic acid containing a fluorine group, from which carboxyl groups have been removed, and more than 50 mol % of B is a divalent group of an aromatic diamine containing no fluorine group and having a solubility in water at 25° C. of 0.1 g/L or more, from which amino groups have been removed, and less than 50 mol %, including 0 mol %, of B is a divalent group of an aliphatic diamine having a molecular weight of 500 or less, from which amino groups have been removed, and/or a divalent group of an aromatic diamine containing a fluorine group, from which amino groups have been removed, and a combination of only a tetravalent group (A) of an aromatic tetracarboxylic acid containing no fluorine group, from which carboxyl groups have been removed, and only a divalent group (B) of an aromatic diamine containing no fluorine group, from which amino groups have been removed, is excluded.

[11] A method for producing a flexible device which is a display device or a light-receiving device, comprising steps of;

applying a polyimide precursor resin composition for flexible device substrates as described in [10] onto a carrier substrate, and then heating the composition to form a solid polyimide resin film;

forming a circuit on the polyimide resin film; and separating the polyimide resin film on which the circuit is formed from the carrier substrate.

[12] A flexible device produced by a method for producing a flexible device as described in [11], wherein the flexible device is a display device or a light-receiving device.

[13] A method for producing an aqueous polyimide precursor solution composition, comprising reacting a tetracarboxylic acid component, which comprises an aromatic tetracarboxylic dianhydride containing no fluorine group in an amount of more than 50 mol % and comprises an aliphatic tetracarboxylic dianhydride and/or an aromatic tetracarboxylic dianhydride containing a fluorine group in an amount of less than 50 mol %, or alternatively, does not comprise an aliphatic tetracarboxylic dianhydride and an aromatic tetracarboxylic dianhydride containing a fluorine group, and a diamine component, which comprises an aromatic diamine containing no fluorine group and having a solubility in water at 25° C. of 0.1 g/L or more in an amount of more than 50 mol % and comprises an aliphatic diamine having a molecular weight of 500 or less and/or an aromatic diamine containing a fluorine group in an amount of less than 50 mol %, or alternatively, does not comprise an aliphatic diamine having a molecular weight of 500 or less and an aromatic diamine containing a fluorine group, in the presence of an imidazole using water as a reaction solvent to provide an aqueous polyimide precursor solution composition, with the proviso that the case where a combination of an aromatic tetracarboxylic dianhydride containing no fluorine group and an aromatic diamine containing no fluorine group is reacted is excluded.

[14] The method for producing an aqueous polyimide precursor solution composition as described in [13], wherein the amount of the imidazole used is 1.6 mole or more per mole of the tetracarboxylic dianhydride.

Effect of the Invention

According to the present invention, there may be provided an aqueous polyimide precursor solution composition which comprises an aqueous solvent and has good environmental acceptability, and may provide a polyimide having excellent properties such as flexibility, heat resistance, mechanical strength, electrical properties, and solvent resistance, and preferably comprises a polyimide precursor (polyamic acid) having a high molecular weight and a solvent containing no organic solvent other than water. A polyimide having excellent properties may be obtained from the aqueous polyimide precursor solution composition, which preferably comprises a polyimide precursor (polyamic acid) having a high molecular weight. There have been no aqueous polyimide precursor solution compositions from which polyimides having such excellent properties can be obtained. The flexibility of the polyimide obtained, in particular, may be improved when using an aliphatic tetracarboxylic dianhydride and/or an aliphatic diamine having a molecular weight of 500 or less in addition to an aromatic tetracarboxylic dianhydride and an aromatic diamine. The flexibility of the polyimide obtained may be also improved when using an aromatic tetracarboxylic dianhydride containing a fluorine group (fluorine atom) and/or an aromatic diamine containing a fluorine group (fluorine atom).

The polyimide which is obtained from the aqueous solution composition of the polyimide precursor having a specific composition and prepared according to the present invention, in particular, has excellent properties such as flexibility, heat resistance, mechanical strength, electrical properties, and solvent resistance. Accordingly, the polyimide may be suitably used as parts for various precision machines such as electrical/electronic equipments and a copying machine, and may be suitably used, for example, as various materials for a flexible printed wiring board and the like, and as a seamless belt for intermediate transfer, fixing, or transport in a copying machine. Meanwhile, the polyimide has a low degree of swelling in a battery environment, and has excellent toughness. Accordingly, the polyimide may also be suitably used as a binder for an electrode of a battery, and the like. In addition, the polyimide may also be suitably used as a substrate of a flexible device, for example, a display device such as a liquid crystal display, an organic EL display and an electronic paper, and a light-receiving device such as a light-receiving element of a thin-film solar cell.

According to the present invention, there may be provided a method for producing a polyimide seamless belt which have excellent properties such as flexibility, heat resistance, mechanical strength, electrical properties, and solvent resistance, and therefore may be suitably used as an intermediate transfer seamless belt or a fixing seamless belt of an electrophotographic device, using an aqueous polyimide precursor solution composition which comprises an aqueous solvent and has good environmental acceptability. The aqueous polyimide precursor solution composition to be used preferably comprises a polyimide precursor (polyamic acid) having a high molecular weight and a solvent containing no organic solvent other than water. The method for producing a polyimide seamless belt using an aqueous polyimide precursor solution composition is preferred because of having high environmental acceptability as compared with a method wherein a polyimide precursor solution composition in which a polyamic acid as a polyimide precursor is dissolved in an organic solvent is used. Moreover, the seamless belt of the polyimide having a specific composition which is obtained according to the production method may have excellent properties such as flexibility, heat resistance, mechanical strength, electrical properties, and solvent resistance, and therefore may be suitably used as an intermediate transfer seamless belt or a fixing seamless belt of an electrophotographic device, in particular, which requires high stability of electrical resistance, and high toughness.

According to the present invention, there may be also provided a binder resin composition for electrodes which comprises an aqueous solvent and has good environmental acceptability, and may provide a polyimide having excellent properties such as flexibility, heat resistance, mechanical strength, electrical properties, and solvent resistance, and furthermore having a low degree of swelling in a battery environment, and having excellent toughness, and preferably comprises a polyimide precursor (polyamic acid) having a high molecular weight and a solvent containing no organic solvent other than water. The binder resin composition for electrodes is preferred because of having high environmental acceptability as compared with a polyimide precursor solution composition comprising an organic solvent. Moreover, the polyimide obtained from the binder resin composition for electrodes and having a specific composition may have excellent properties such as flexibility, heat resistance, mechanical strength, electrical properties, and solvent resistance, and have a low degree of swelling in a battery environment, and have excellent toughness, and therefore may be suitably used as a binder resin composition for electrodes of electrochemical devices such as a lithium ion secondary battery and an electric double layer capacitor.

According to the present invention, there may be also provided a polyimide precursor resin composition for flexible device substrates which comprises an aqueous solvent and has good environmental acceptability, and may provide a polyimide substrate for flexible device having excellent properties such as flexibility, heat resistance, mechanical strength, electrical properties, and solvent resistance, and being suitably usable as a substrate for flexible device as a display device such as substrates for a liquid crystal display, an organic EL display and an electronic paper, a substrate for flexible device as a light-receiving device such as a substrate for a thin-film solar cell, and the like, and preferably comprises a polyimide precursor (polyamic acid) having a high molecular weight and a solvent containing no organic solvent other than water. The polyimide precursor resin composition for flexible device substrates is preferred because of having high environmental acceptability as compared with a polyimide precursor solution composition comprising an organic solvent. Moreover, the polyimide substrate for flexible device which is obtained from the polyimide precursor resin composition and has a specific composition may have excellent properties such as flexibility, heat resistance, mechanical strength, electrical properties, and solvent resistance, and therefore may be suitably used, for example, as a substrate for flexible device which is a display device such as substrates for a liquid crystal display, an organic EL display and an electronic paper, and as a substrate for flexible device which is a light-receiving device such as a substrate for a thin-film solar cell, in particular, which requires flexibility, and high toughness, and may be particularly suitably used as a substrate for a flexible display.

Moreover, according to the present invention, there may be provided a method for easily producing an aqueous polyimide precursor solution composition, which has higher environmental acceptability, without the need for a solvent other than water. According to the production method, an aqueous polyimide precursor solution composition, particularly an aqueous polyimide precursor solution composition comprising an aqueous solvent which has an organic solvent content of less than 5 wt %, further preferably contains no organic solvent, may be very easily (directly) produced. There have been no aqueous polyimide precursor solution compositions having such an extremely low organic solvent content. Now such an aqueous polyimide precursor solution composition may be produced by the production method of the present invention, which allows the reaction of a tetracarboxylic acid component and a diamine component in an aqueous solvent to form a polyimide precursor (polyamic acid).

DETAILED DESCRIPTION OF THE PREFERRED EMBODIMENT

According to the present invention, an aqueous polyimide precursor solution composition is produced by reacting a tetracarboxylic dianhydride and a diamine in the presence of an imidazole, using water as a reaction solvent, provided that more than 50 mol % of the tetracarboxylic dianhydride to be reacted is an aromatic tetracarboxylic dianhydride containing no fluorine group, preferably an aromatic tetracarboxylic dianhydride having two to three aromatic rings and containing no fluorine group, and less than 50 mol %, including 0 mol %, of the tetracarboxylic dianhydride to be reacted is an aliphatic tetracarboxylic dianhydride and/or an aromatic tetracarboxylic dianhydride containing a fluorine group, and more than 50 mol % of the diamine to be reacted is an aromatic diamine having a solubility in water at 25° C. of 0.1 g/L or more and containing no fluorine group, preferably an aromatic diamine having one to two aromatic rings, and having a solubility in water at 25° C. of 0.1 g/L or more and containing no fluorine group, and less than 50 mol %, including 0 mol %, of the diamine to be reacted is an aliphatic diamine having a molecular weight of 500 or less and/or an aromatic diamine containing a fluorine group, preferably an aromatic diamine having one to two aromatic rings, and containing a fluorine group,
with the proviso that
a combination of an aromatic tetracarboxylic dianhydride containing no fluorine group and an aromatic diamine containing no fluorine group only is excluded.

The term "using water as a reaction solvent" means that water is used as the main component of the solvent. Therefore, an organic solvent other than water may be used in a ratio of 50 wt % or less, preferably 30 wt % or less, more preferably 10 wt % or less, relative to the whole solvent. The "organic solvent" as used herein does not include a tetracarboxylic acid component such as tetracarboxylic dianhydride, a diamine component, a polyimide precursor such as polyamic acid, and an imidazole.

Examples of the organic solvent include N,N-dimethylformamide, N,N-dimethylacetamide, N, N-diethylacetamide, N-methyl-2-pyrrolidone, N-ethyl-2-pyrrolidone, 1,3-dimethyl-2-imidazolidinone, N-methylcaprolactam, hexamethylphosphoric triamide, 1,2-dimethoxyethane, bis(2-methoxyethyl)ether, 1,2-bis(2-methoxyethoxy)ethane, tetrahydrofuran, bis[2-(2-methoxyethoxy)ethyl]ether, 1,4-dioxane, dimethyl sulfoxide, dimethyl sulfone, diphenyl ether, sulfolane, diphenyl sulfone, tetramethylurea, anisole, m-cresol, phenol, and γ-butyrolactone.

In the method for producing an aqueous polyimide precursor solution composition of the present invention, the reaction solvent is preferably a solvent having an organic solvent content of less than 5 wt %, particularly preferably an aqueous solvent containing no organic solvent other than water, in view of high environmental acceptability. The composition of the reaction solvent may be appropriately selected depending on the intended solvent composition of the aqueous polyimide precursor solution composition to be produced, and it may be preferably the same as the intended solvent composition of the aqueous polyimide precursor solution composition.

Preferable examples of the imidazole (compound) used in the present invention include a compound represented by the following formula (10).

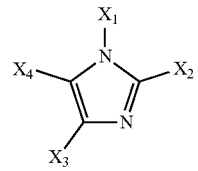

Formula (10)

In the formula (10), $X_1$ to $X_4$ each independently represents a hydrogen atom or an alkyl group having 1 to 5 carbon atoms.

The imidazole used in the present invention preferably has a solubility in water at 25° C. of 0.1 g/L or more, particularly preferably 1 g/L or more.

In the imidazole of the formula (10), $X_1$ to $X_4$ each independently represents a hydrogen atom or an alkyl group having 1 to 5 carbon atoms. An imidazole in which at least two of $X_1$ to $X_4$ are alkyl groups having 1 to 5 carbon atoms, or an imidazole having two or more alkyl groups as substituents is more preferred.

An imidazole having two or more alkyl groups as substituents has high solubility in water, and therefore, when using such an imidazole, an aqueous polyimide precursor solution composition may be easily produced. Preferable examples of the imidazole include 1,2-dimethylimidazole (solubility in water at 25° C.; 239 g/L; the same shall apply hereinafter), 2-ethyl-4-methylimidazole (1000 g/L), 4-ethyl-2-methylimidazole (1000 g/L), and 1-methyl-4-ethylimidazole (54 g/L).

The "solubility in water at 25° C." means the maximum amount (g) of the substance soluble in 1 L (liter) of water at 25° C. This value may be easily searched using SciFinder®, which is known as a search service based on the data bases such as Chemical Abstracts. Among the various values of solubility under various conditions, the values at pH 7, which are calculated by Advanced Chemistry Development (ACD/Labs) Software V11.02 (Copyright 1994-2011 ACD/Labs), are used herein.

The imidazole to be used may be a single imidazole, or may be a mixture of two or more imidazoles.

The amount of the imidazole used in the present invention is preferably 0.8 equivalents or more, more preferably 1.0 equivalent or more, further preferably 1.2 equivalents or more per equivalent of the carboxyl group of the polyamic acid, which is formed by the reaction of a tetracarboxylic dianhydride and a diamine as starting materials. When the amount of the imidazole used is less than 0.8 equivalents per equivalent of the carboxyl group of the polyamic acid, it may not be easy to provide an aqueous polyimide precursor solution composition in which the polyamic acid is homogeneously dissolved. In addition, the upper limit of the amount of the imidazole used may be generally, but not limited to, less than 10 equivalents, preferably less than 5 equivalents, more preferably less than 3 equivalents per equivalent of the carboxyl group of the polyamic acid. If the amount of the imidazole used is too great, it will be uneconomical, and the storage stability of the aqueous polyimide precursor solution composition may be reduced.

In the present invention, the "equivalents per equivalent of the carboxyl group of the polyamic acid", which defines the amount of the imidazole, means the number (number of molecules) of imidazole used per one carboxyl group to form an amic acid group in the polyamic acid. The number of carboxyl groups to form amic acid groups in the polyamic acids may be calculated on the assumption that two carboxyl groups would be formed per one molecule of the tetracarboxylic acid component as a starting material.

Accordingly, the amount of the imidazole used in the present invention is preferably 1.6 mole or more, more preferably 2.0 mole or more, further preferably 2.4 mole or more per mole of the tetracarboxylic dianhydride as a starting material (per mole of the tetracarboxylic acid component of the polyamic acid).

The characteristics of the imidazole used in the present invention are that the imidazole forms a salt with a carboxyl group of a polyamic acid (polyimide precursor), which is formed by the reaction of a tetracarboxylic dianhydride and a diamine as starting materials, thereby increasing the solubility of the polyamic acid in water, and also that the imidazole exhibits a very high catalytic activity during the imidization (dehydration/ring closure) of the polyimide precursor to form a polyimide. Consequently, when using the aqueous polyimide precursor solution composition of the present invention, a polyimide, a polyimide seamless belt, a binder resin for electrodes, and a substrate for flexible devices, which have very high properties, may be easily produced even though the aqueous polyimide precursor solution composition is heated at a lower temperature for a shorter period of time, for example.

As described above, according to the present invention, an aqueous polyimide precursor solution composition may be very easily (directly) produced preferably by reacting a tetracarboxylic acid component and a diamine component in the presence of an imidazole, preferably in the presence of an imidazole having two or more alkyl groups as substituents, using water as a reaction solvent.

The reaction is performed at a relatively low temperature of 100° C. or lower, preferably 80° C. or lower, so as to suppress the imidization reaction, using substantially equimolar amounts of a tetracarboxylic acid component (tetracarboxylic dianhydride) and a diamine component. The reaction temperature may be generally, but not limited to, from 25° C. to 100° C., preferably from 40° C. to 80° C., more preferably from 50° C. to 80° C. The reaction time may be preferably, but not limited to, from about 0.1 hours to about 24 hours, preferably from about 2 hours to about 12 hours. When setting the reaction temperature and the reaction time within the ranges as described above, an aqueous polyimide precursor solution composition which comprises a polyimide precursor having a high molecular weight may be easily produced with good production efficiency. In general, the reaction may be preferably performed in an inert gas atmosphere, preferably in a nitrogen gas atmosphere, although the reaction may be performed in an air atmosphere.

In addition, the "substantially equimolar amounts of a tetracarboxylic acid component (tetracarboxylic dianhydride) and a diamine component" specifically means that a molar ratio [tetracarboxylic acid component/diamine component] is from about 0.90 to about 1.10, preferably from about 0.95 to about 1.05.

The tetracarboxylic dianhydride used in the present invention is an aromatic tetracarboxylic dianhydride containing no fluorine group and preferably having two to three aromatic rings, or alternatively, an aromatic tetracarboxylic dianhydride containing no fluorine group and preferably having two to three aromatic rings, and an aliphatic tetracarboxylic dianhydride and/or an aromatic tetracarboxylic dianhydride containing a fluorine group, and may be more preferably, but not limited to, a combination of an aromatic tetracarboxylic dianhydride containing no fluorine group and an alicyclic tetracarboxylic dianhydride, in terms of the properties of the polyimide obtained. When the diamine component to be reacted is only an aromatic diamine containing no fluorine group, however, both an aromatic tetracarboxylic dianhydride containing no fluorine group, and an aliphatic tetracarboxylic dianhydride and/or an aromatic tetracarboxylic dianhydride containing a fluorine group are used.

Preferable examples of the aromatic tetracarboxylic dianhydride containing no fluorine group used in the present invention include 3,3',4,4'-biphenyltetracarboxylic dianhydride, 2,3,3',4'-biphenyltetracarboxylic dianhydride, 2,2',3,3'-biphenyltetracarboxylic dianhydride, pyromellitic dianhydride, benzophenone tetracarboxylic dianhydride, 4,4'-oxydiphthalic dianhydride, diphenylsulfone tetracarboxylic dianhydride, p-terphenyl tetracarboxylic dianhydride, and m-terphenyl tetracarboxylic dianhydride.

Preferable examples of the aliphatic tetracarboxylic dianhydride used in the present invention include cyclobutane-1,2,3,4-tetracarboxylic dianhydride, 1,2,4,5-cyclohexane tetracarboxylic dianhydride, dicyclohexyl-3,3',4,4'-tetracarboxylic dianhydride, 1,2,4,5-cyclohexane tetracarboxylic acid-1,2:4,5-dianhydride, 1,2,3,4-cyclobutane tetracarboxylic dianhydride, and bicyclo[2.2.2]octo-7-ene-2,3;5,6-tetracarboxylic dianhydride.

Preferable examples of the aromatic tetracarboxylic dianhydride containing a fluorine group used in the present invention include 4,4'-(hexafluoroisopropylidene)diphthalic anhydride, 3,3'-(hexafluoroisopropylidene)diphthalic anhydride, 5,5'-[2,2,2-trifluoro-1-[3-(trifluoromethyl)phenyl]ethylidene]diphthalic anhydride, 5,5'-[2,2,3,3,3-pentafluoro-1-(trifluoromethyl)propylidene]diphthalic anhydride, 1H-diflo[3,4-b:3',4'-i]xanthene-1,3,7,9(11H)-tetron, 5,5'-oxybis[4,6,7-trifluoro-pyromellitic anhydride], 3,6-bis(trifluoromethyl)pyromellitic dianhydride, 4-(trifluoromethyl)pyromellitic dianhydride, 1,4-difluoropyromellitic dianhydride, and 1,4-bis(3,4-dicarboxytrifluorophenoxy) tetrafluorobenzene dianhydride.

The aromatic tetracarboxylic dianhydride containing no fluorine group, the aliphatic tetracarboxylic dianhydride, and the aromatic tetracarboxylic dianhydride containing a fluorine group each may not be a single component, and may be a mixture of two or more types thereof.

The diamine used in the present invention is an aromatic diamine having a solubility in water at 25° C. of 0.1 g/L or more and containing no fluorine group and preferably having one to two aromatic rings, or alternatively, an aromatic diamine having a solubility in water at 25° C. of 0.1 g/L or more and containing no fluorine group and preferably having one to two aromatic rings, and an aliphatic diamine having a molecular weight of 500 or less and/or an aromatic diamine containing a fluorine group. When the tetracarboxylic acid component to be reacted is only an aromatic tetracarboxylic dianhydride containing no fluorine group, however, both an aromatic diamine containing no fluorine group, and an aliphatic diamine and/or an aromatic diamine containing a fluorine group are used.

The aromatic diamine containing no fluorine group used in the present invention is not limited as long as the solubility in water at 25° C. is 0.1 g/L or more, but may be preferably an aromatic diamine having one to two aromatic rings. When an aromatic diamine having a solubility in water at 25° C. of less than 0.1 g/L is used, it may be difficult to provide an aqueous polyimide precursor solution composition in which the polyimide precursor is homogeneously dissolved. Meanwhile, when the aromatic diamine has more than two aromatic rings, the aromatic diamine may have a solubility in water at 25° C. of less than 0.1 g/L, and therefore it may be difficult to provide an aqueous polyimide precursor solution composition in which the polyimide precursor is homogeneously dissolved.

The aliphatic diamine used in the present invention is not limited as long as the molecular weight (which means "molecular weight" in the case of monomer, and "weight average molecular weight" in the case of polymer) is 500 or less, but may be preferably an aliphatic diamine having a solubility in water at 25° C. of 0.1 g/L or more, or an alicyclic diamine having one to two alicyclic rings. When an aliphatic diamine having a molecular weight of more than 500 is used, it may be difficult to provide an aqueous polyimide precursor solution composition in which the polyimide precursor is homogeneously dissolved.

The aromatic diamine containing a fluorine group used in the present invention may be preferably, but not limited to, an aromatic diamine having one to two aromatic rings and containing a fluorine group. When the aromatic diamine containing a fluorine group has more than two aromatic rings, it may be difficult to provide an aqueous polyimide precursor solution composition in which the polyimide precursor is homogeneously dissolved.

Preferable examples of the aromatic diamine containing no fluorine group used in the present invention include p-phenylenediamine (solubility in water at 25° C.; 120 g/L; the same shall apply hereinafter), m-phenylenediamine (77 g/L), 4,4'-diaminodiphenyl ether (0.19 g/L), 3,4'-diaminodiphenyl ether (0.24 g/L), 4,4'-diaminodiphenylmethane (0.54 g/L), 2,4-toluenediamine (62 g/L), 3,3'-dihydroxy-4,4'-diaminobiphenyl (1.3 g/L), bis(4-amino-3-carboxyphenyl)methane (200 g/L), and 2,4-diaminotoluene (62 g/L). Among them, in terms of the high solubility in water, and excellent properties of the polyimide obtained, p-phenylenediamine, m-phenylenediamine, 4,4'-diaminodiphenyl ether, 3,4'-diaminodiphenyl ether, and a mixture thereof are preferred, and p-phenylenediamine, 4,4'-diaminodiphenyl ether, and a mixture thereof are more preferred.

Preferable examples of the aliphatic diamine used in the present invention include trans-1,4-diaminocyclohexane (1000 g/L, molecular weight: 114), cis-1,4-diaminocyclohexane (1000 g/L, molecular weight: 114), 1,6-hexamethylene diamine (1000 g/L, molecular weight: 116), 1,10-decamethylene diamine (1000 g/L, molecular weight: 172), 1,3-bis(aminomethyl)cyclohexane (1000 g/L, molecular weight: 142), 1,4-bis(aminomethyl)cyclohexane (999 g/L, molecular weight: 142), and polyoxypropylene diamine having a weight average molecular weight of 500 or less.

Preferable examples of the aromatic diamine containing a fluorine group used in the present invention include 2,2'-bis(trifluoromethyl)-4,4'-diaminobiphenyl, 2,3,5,6-tetrafluoro-1,4-diaminobenzene, 2,4,5,6-tetrafluoro-1,3-diaminobenzene, 2,3,5,6-tetrafluoro-1,4-benzene(dimethanamine), 2,2'-difluoro-(1,1'-biphenyl)-4,4'-diamine, 2,2',6,6'-tetrafluoro-(1,1'-biphenyl)-4,4'-diamine, 4,4'-diamino octafluorobiphenyl, 2,2-bis(4-aminophenyl) hexafluoropropane, and 4,4'-oxybis(2,3,5,6-tetrafluoroaniline).

The aromatic diamine containing no fluorine group, the aliphatic diamine, and the aromatic diamine containing a fluorine group each may not be a single component, and may be a mixture of two or more types thereof. As for the aromatic diamine containing no fluorine group, it is also possible to use a diamine which has a high solubility in water in combination with other diamines such that the diamine component has a solubility in water at 25° C. of 0.1 g/L or more as a whole.

The "diamine having a solubility in water at 25° C. of 0.1 g/L or more" means that 0.1 g or more of the diamine is dissolved in 1 L (1000 ml) of water at 25° C. The "solubility in water at 25° C." means the maximum amount (g) of the substance soluble in 1 L (liter) of water at 25° C. This value may be easily searched using SciFinder®, which is known as a search service based on the data bases such as Chemical Abstracts. Among the various values of solubility under various conditions, the values at pH 7, which are calculated by Advanced Chemistry Development (ACD/Labs) Software V11.02 (Copyright 1994-2011 ACD/Labs), are used herein.

In the present invention, it is preferred that
(I) a tetracarboxylic acid component consisting of one or more aromatic tetracarboxylic dianhydrides containing no fluorine group, and one or more aliphatic tetracarboxylic dianhydrides and/or one or more aromatic tetracarboxylic dianhydrides containing a fluorine group, and a diamine component consisting of one or more aromatic diamines containing no fluorine group are reacted, or
(II) a tetracarboxylic acid component consisting of one or more aromatic tetracarboxylic dianhydrides containing no fluorine group, and a diamine component consisting of one or more aromatic diamines containing no fluorine group, and one or more aliphatic diamines and/or one or more aromatic diamines containing a fluorine group are reacted.
In the case of (I), the amount of the aromatic tetracarboxylic dianhydride containing no fluorine group in the tetracarboxylic acid component is not limited as long as the amount is more than 50 mol %, but may be preferably more than 50 mol % and not more than 80 mol % in terms of the properties of the polyimide obtained. In the case of (II), the amount of the aromatic diamine having a solubility in water at 25° C. of 0.1 g/L or more and containing no fluorine group in the diamine component is not limited as long as the amount is more than 50 mol %, but may be preferably not less than 60 mol % and not more than 90 mol % in terms of the properties of the polyimide obtained.

The polyamic acid which constitutes the aqueous polyimide precursor solution composition of the present invention consists of a repeating unit represented by the formula (1).

In the formula (1), the "A" group is a chemical structure derived from the tetracarboxylic acid component of a polyamic acid, and is a tetravalent group of an aromatic tetracarboxylic acid containing no fluorine group and preferably having two to three aromatic rings, from which carboxyl groups have been removed, and/or a tetravalent group of an aliphatic tetracarboxylic acid, from which carboxyl groups have been removed, and/or a tetravalent group of an aromatic tetracarboxylic acid containing a fluorine group, from which carboxyl groups have been removed.

As for the "A" group in the formula (1), more than 50 mol % of A is preferably a tetravalent group of an aromatic tetracarboxylic acid containing no fluorine group and preferably having two to three aromatic rings, from which carboxyl groups have been removed, and less than 50 mol % of A is preferably a tetravalent group of an aliphatic tetracarboxylic acid, from which carboxyl groups have been removed, and/or a tetravalent group of an aromatic tetracarboxylic acid containing a fluorine group, from which carboxyl groups have been removed, so as to provide a polyamic acid having an adequate solubility in water, and to provide a polyimide having excellent flexibility, heat resistance, mechanical strength, electrical properties and solvent resistance, thereby easily producing a polyimide seamless belt, a binder resin for electrodes, and a polyimide substrate for flexible devices, which have high properties.

In the present invention, in terms of the properties of the polyimide obtained, the "A" group in the formula (1) which is a constituent unit derived from the aromatic tetracarboxylic dianhydride containing no fluorine group is preferably any one or more of the groups represented by the following formulas (2) to (7), particularly preferably any one or more of the groups represented by the following formulas (2), (3) and (5) in the main, further preferably any one or more of the groups represented by the following formulas (2) to (3).

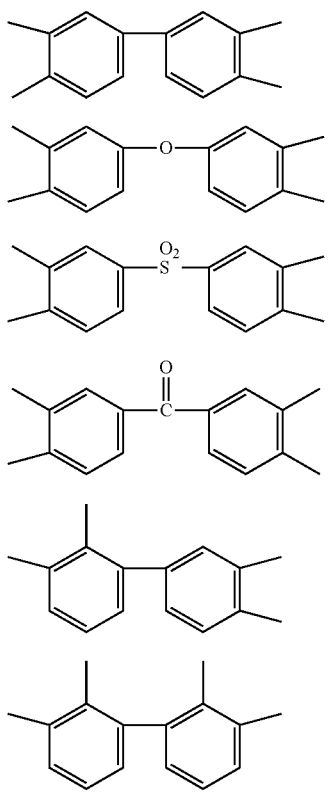

Formula (2)

Formula (3)

Formula (4)

Formula (5)

Formula (6)

Formula (7)

In the formula (1), the "B" group is a chemical structure derived from the diamine component of a polyamic acid, and is a divalent group of an aromatic diamine having a solubility in water at 25° C. of 0.1 g/L or more and containing no fluorine group and preferably having one to two aromatic rings, from which amino groups have been removed, and/or a divalent group of an aliphatic diamine having a molecular weight of 500 or less, preferably an aliphatic diamine having a solubility in water of 0.1 g/L or more, or an aliphatic diamine having one to two alicyclic rings, from which amino groups have been removed, and/or a divalent group of an aromatic diamine containing a fluorine group, preferably an aromatic diamine containing a fluorine group and having one to two aromatic rings, from which amino groups have been removed.

As for the "B" group in the formula (1), more than 50 mol % of B is preferably a divalent group of an aromatic diamine having a solubility in water at 25° C. of 0.1 g/L or more and containing no fluorine group and preferably having one to two aromatic rings, from which amino groups have been removed, and less than 50 mol % of B is preferably a divalent group of an aliphatic diamine having a molecular weight of 500 or less, from which amino groups have been removed, and/or a divalent group of an aromatic diamine containing a fluorine group, from which amino groups have been removed, so as to provide a polyamic acid having an adequate solubility in water, and to provide a polyimide having excellent flexibility, heat resistance, mechanical strength, electrical properties and solvent resistance, thereby easily producing a polyimide seamless belt, a binder resin for electrodes, and a polyimide substrate for flexible devices, which have high properties.

In the present invention, in terms of the properties of the polyimide obtained, the "B" group in the formula (1) which is a constituent unit derived from the aromatic diamine containing no fluorine group is preferably any one or more of the groups represented by the following formulas (8) to (9).

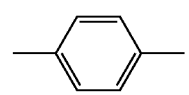

Formula (8)

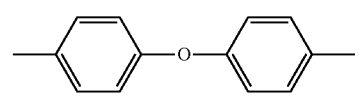

Formula (9)

In the aqueous polyimide precursor solution composition obtained according to the present invention, the polyimide precursor (which is substantially a polyamic acid) preferably has a high molecular weight, and more specifically, has an inherent viscosity of 0.2 or more, preferably 0.4 or more, more preferably 0.6 or more, further preferably 0.8 or more, particularly preferably 1.0 or more, or more than 1.0, wherein the inherent viscosity is measured at a temperature of 30° C. and a concentration of 0.5 g/100 mL (dissolved in water) which is based on the solid content of the polyimide precursor. When the inherent viscosity is lower than the range as described above, the polyimide precursor has a low molecular weight, and therefore it may be difficult to provide a polyimide, a polyimide seamless belt, a binder resin for electrodes, and a polyimide substrate for flexible devices, which have high properties, even if the aqueous polyimide precursor solution composition of the present invention is used.

The solid content based on the polyimide precursor (which is substantially a polyamic acid) of the aqueous polyimide precursor solution composition of the present invention may be preferably, but not limited to, from 5 wt % to 45 wt %, more preferably from 7 wt % to 40 wt %, further preferably from 9 wt % to 30 wt %, relative to the total amount of the polyimide precursor and the solvent. When the solid content is lower than 5 wt %, the productivity and the handling in use may be reduced. When the solid content is higher than 45 wt %, the solution may lose the fluidity.

In view of handling properties, the solution viscosity at 30° C. of the aqueous polyimide precursor solution composition of the present invention may be preferably, but not limited to, 1000 Pa·sec or lower, more preferably from 0.5 Pa·sec to 500 Pa·sec, further preferably from 1 Pa·sec to 300 Pa·sec, particularly preferably from 3 Pa·sec to 200 Pa·sec. When the solution viscosity is higher than 1000 Pa·sec, the composition may lose the fluidity, and therefore it may be difficult to uniformly apply the composition onto a metal (such as a current collecting foil), a glass, and the like. When the solution viscosity is lower than 0.5 Pa·sec, dripping, cissing, and the like may occur when applying the composition onto a metal (such as a current collecting foil), a glass, and the like, and it may be difficult to provide a polyimide, a polyimide seamless belt, a binder resin for electrodes, and a polyimide substrate for flexible devices, which have high properties.

Although the aqueous polyimide precursor solution composition of the present invention comprises an aqueous solvent, an organic solvent other than water, for example, a known organic solvent to be used in the preparation of a polyamic acid may be used in a ratio of 50 wt % or less, preferably 30 wt % or less, more preferably 10 wt % or less, relative to the whole solvent. In other words, the aqueous polyimide precursor solution composition of the present invention is a composition in which a polyamic acid as a polyimide precursor is dissolved, together with an imidazole, in an aqueous solvent (water-based solvent), wherein the aqueous solvent is only water, or a mixture of water and an organic solvent having a water content of 50 wt % or more, preferably 70 wt % or more, more preferably 90 wt % or more.

Examples of the organic solvent include N,N-dimethylformamide, N,N-dimethylacetamide, N, N-diethylacetamide, N-methyl-2-pyrrolidone, N-ethyl-2-pyrrolidone, 1,3-dimethyl-2-imidazolidinone, N-methylcaprolactam, hexamethylphosphoric triamide, 1,2-dimethoxyethane, bis (2-methoxyethyl)ether, 1,2-bis(2-methoxyethoxy)ethane, tetrahydrofuran, bis[2-(2-methoxyethoxy)ethyl]ether, 1,4-dioxane, dimethyl sulfoxide, dimethyl sulfone, diphenyl ether, sulfolane, diphenyl sulfone, tetramethylurea, anisole, m-cresol, phenol, and γ-butyrolactone.

In the aqueous polyimide precursor solution composition of the present invention, the solvent is particularly preferably a solvent having an organic solvent content of less than 5 wt %, more preferably an aqueous solvent containing no organic solvent other than water, i.e. only water, in view of environmental acceptability.

The aqueous polyimide precursor solution composition of the present invention may also be prepared according to the following methods, for example, as described in Patent Literatures 1 and 2:
 (i) a method, comprising
  pouring a polyamide acid, which is prepared by reacting a tetracarboxylic acid component with a diamine component in an organic solvent as a reaction solvent, into water to provide a polyamide acid powder; and
  mixing and dissolving the polyamide acid powder, together with an imidazole (preferably, an imidazole having two or more alkyl groups), into an aqueous solvent to provide an aqueous solution composition;
 (ii) a method, comprising
  reacting a tetracarboxylic acid component with a diamine component in an organic solvent as a reaction solvent in the presence of an imidazole (preferably, an imidazole having two or more alkyl groups) to provide a water-soluble polyimide precursor;
  separating the water-soluble polyimide precursor therefrom; and
  dissolving the separated water-soluble polyimide precursor in an aqueous solvent; and
 (iii) a method, comprising
  reacting a tetracarboxylic acid component with a diamine component in an organic solvent as a reaction solvent to provide a polyamic acid;
  reacting the polyamic acid with an imidazole (preferably, an imidazole having two or more alkyl groups) in an organic solvent as a reaction solvent to provide a water-soluble polyimide precursor;
  separating the water-soluble polyimide precursor therefrom; and
  dissolving the separated water-soluble polyimide precursor in an aqueous solvent.

As described above, however, in order to obtain an aqueous polyimide precursor solution composition having an extremely low organic solvent content, or containing no organic solvent, it is not preferred that a polyimide precursor is prepared in an organic solvent.

Generally, a polyimide may be suitably prepared by heating the aqueous polyimide precursor solution composition of the present invention to remove an aqueous solvent and effect imidization (dehydration/ring closure). The heat treatment conditions are not limited, but, in general, the aqueous polyimide precursor solution composition may be preferably heated at a temperature of 100° C. or higher, preferably from 120° C. to 600° C., more preferably from 150° C. to 500° C., further preferably from 150° C. to 350° C., for from 0.01 hours to 30 hours, preferably from 0.01 hours to 10 hours, preferably while increasing the temperature stepwise.

The heat treatment may be suitably performed under atmospheric pressure, and may be performed under reduced pressure so as to efficiently remove the aqueous solvent. The aqueous polyimide precursor solution composition may be heated at a relatively low temperature under reduced pressure at the early stage for deaeration. When the heating temperature is rapidly increased, a problem such as foaming may occur.

The aqueous polyimide precursor solution composition of the present invention may be heated at a relatively low temperature (for example, 150° C. to 300° C., preferably 180° C. to 250° C.) to readily provide a polyimide, which has excellent properties, for example, high adhesiveness to a metal and the like, and is in no way inferior to a polyimide obtained from a commonly-used polyimide precursor (polyamic acid) solution composition comprising an organic solvent. Accordingly, a polyimide seamless belt and the like, as well as a polyimide film, may be suitably obtained from the aqueous polyimide precursor solution composition of the present invention.

According to the method for producing the polyimide seamless belt of the present invention, a coating film of an aqueous polyimide precursor solution composition layer is formed on a substrate by applying or spraying an aqueous polyimide precursor solution composition (specifically, an aqueous polyimide precursor solution composition in which a polyamic acid consisting of a repeating unit represented by the formula (1) is homogeneously dissolved in an aqueous solvent together with an imidazole in an amount of 1.6 mole or more per mole of the tetracarboxylic acid component of the polyamic acid) onto the substrate surface, and then the aqueous polyimide precursor solution composition is heated.

According to the present invention, a polyimide seamless belt may be suitably prepared by heating the aqueous polyimide precursor solution composition to remove an aqueous solvent and effect imidization (dehydration/ring closure). The heat treatment conditions are not limited, but, in general, the aqueous polyimide precursor solution composition may be preferably heated at a temperature of 100° C. or higher, preferably from 120° C. to 600° C., more preferably from 150° C. to 500° C., further preferably from 150° C. to 350° C., for from 0.01 hours to 30 hours, preferably from 0.01 hours to 10 hours, preferably while increasing the temperature stepwise.

The heat treatment may be suitably performed under atmospheric pressure, and may be performed under reduced pressure so as to efficiently remove the aqueous solvent. The aqueous polyimide precursor solution composition may be heated at a relatively low temperature under reduced pressure at the early stage for deaeration. When the heating temperature is rapidly increased, a problem such as foaming may occur, and therefore a polyimide seamless belt having excellent properties may not be obtained.

According to the method for producing the polyimide seamless belt of the present invention, the aqueous polyimide precursor solution composition may be heated at a relatively low temperature (for example, 150° C. to 300° C., preferably 180° C. to 250° C.) to readily provide a polyimide seamless belt, which has excellent properties, and is in no way inferior to a polyimide seamless belt obtained from a commonly-used polyimide precursor (polyamic acid) solution composition comprising an organic solvent.

Any known method for forming a seamless belt may be suitably employed. For example, a seamless belt may be suitably produced by rotational molding, i.e. a method comprising forming a coating film of an aqueous polyimide precursor solution composition by application (coating) or spraying, for example, on a surface (inner surface or outer surface) of a cylindrical mold, which functions as a substrate, while rotating the mold;

heating the coating film at a relatively low temperature to effect the removal of the aqueous solvent, thereby forming a self-supporting film (the film in a state of not flowing; the polymerization and partial imidization reaction, as well as the removal of the aqueous solvent, proceed); and heating the self-supporting film on the substrate, or alternatively, the self-supporting film which is peeled from the substrate, if necessary, to effect dehydration/imidization.

The terms "removal of the aqueous solvent" and "dehydration/imidization" as used herein do not mean that only the removal of the aqueous solvent proceeds and only the dehydration/imidization proceeds, respectively, in the steps. In the aqueous solvent removal step, the dehydration/imidization proceeds to some extent. In the dehydration/imidization step, the removal of the residual aqueous solvent proceeds.

The aqueous polyimide precursor solution composition of the present invention may contain other additive component(s) depending on the intended application of the polyimide seamless belt obtained. Additionally, another resin layer and/or a metal layer may be laminated on the polyimide seamless belt obtained.

The thickness of the polyimide seamless belt of the present invention may be appropriately selected depending on the intended use, and it may be generally from about 20 µm to about 200 µm.

The polyimide seamless belt obtained according to the present invention preferably has excellent properties such as flexibility, heat resistance, mechanical strength, electrical properties, and solvent resistance, and therefore it may be suitably used as an intermediate transfer seamless belt or a fixing seamless belt of an electrophotographic device.

When the polyimide seamless belt is used as an intermediate transfer belt of an electrophotographic device, a conductive filler may be preferably added to the seamless belt so that semiconductivity is imparted to the seamless belt, specifically, the seamless belt has a surface resistivity of $10^8$ $\Omega/\square$ to $10^{16} \Omega/\square$ and a volume resistivity of $10^8$ $\Omega \cdot cm$ to $10^{16}$ $\Omega \cdot cm$.

A conductive or semiconductive particle which is used for a conventional intermediate transfer seamless belt may be used as the conductive filler. Examples thereof include, but not limited to, carbon blacks such as ketjen black and acetylene black, metals such as aluminum and nickel, metal oxide compounds such as tin oxide, and potassium titanate. The conductive filler may be used alone or in combination of two or more. In the present invention, a carbon black may be preferably used as the conductive filler, and, among them, a carbon black having an average primary particle size of from 5 nm to 100 nm, particularly preferably from 10 nm to 50 nm, is particularly preferred. When the average primary particle size is more than 100 nm, the uniformity of mechanical properties and electric resistance may be liable to be inadequate.

The amount of the conductive filler may vary depending on the type, particle size, and a dispersion state of the filler. In general, the amount of the conductive filler is preferably from 1 to 50 parts by weight, more preferably from 2 to 30 parts by weight, relative to 100 parts by weight of the polyimide (solid content). In the present invention, the surface resistivity and the volume resistivity may be controlled to within the range ($10^8 \Omega/\square$ to $10^{16} \Omega/\square$, and $10^8$ $\Omega \cdot cm$ to $10^{16}$ $\Omega \cdot cm$) suitable for an intermediate transfer belt by a combination of the selection of the conductive filler and its appropriate amount.

When the polyimide seamless belt is used as a fixing belt of an electrophotographic device, a filler such as silica, boron nitride, aluminum nitride, silicon nitride, and alumina may be preferably added to the seamless belt so that thermal conductivity is imparted to the seamless belt, and a fluororesin powder, for example, may be preferably added to the seamless belt so that rubber elasticity is imparted to the seamless belt, and a metal foil as a heating element may be preferably laminated on the seamless belt. In general, the amount of the filler is preferably from 1 to 50 parts by weight, more preferably from 2 to 30 parts by weight, relative to 100 parts by weight of the polyimide (solid content).

When the polyimide seamless belt is used as a fixing belt of an electrophotographic device, the seamless belt may preferably have a thermal conductivity of 0.15 W/mK or more, preferably 0.20 W/mK or more.

In addition, when the polyimide seamless belt is used as a fixing belt of an electrophotographic device, the seamless belt may preferably have a rubber elastic layer or a release layer laminated on the surface. The release layer (parting layer) is not limited as long as the layer improves the releasability of the surface of the seamless belt, and a known material including polytetrafluoroethylene (PTFE), and a modified material thereof such as tetrafluoroethylene-perfluoroalkylvinylether copolymer (PFA), tetrafluoroethylene-ethylene copolymer (ETFE), tetrafluoroethylene-hexafluoropropylene copolymer (FEP), tetrafluoroethylene-vinylidene fluoride copolymer (TFE/VdF), tetrafluoroethylene-hexafluoropropylene-perfluoroalkylvinylether copolymer (EPA), polychlorotrifluoroethylene (PCTFE), chlorotrifluoroethylene-ethylene copolymer (ECTFE), chlorotrifluoroethylene-vinylidene fluoride copolymer (CTFE/VdF), polyvinylidene fluoride (PVdF), and polyvinyl fluoride (PVF) may be suitably used for the release layer. The rubber elastic layer may also be formed of the material as described above. The surface layer may preferably contain a conductive filler.

The aqueous polyimide precursor solution composition of the present invention may also be suitably used as a binder resin composition for electrodes.

Generally, a polyimide may be suitably prepared by heating the aqueous polyimide precursor solution composition of the present invention (binder resin composition for electrodes of the present invention) to remove an aqueous solvent and effect imidization (dehydration/ring closure) in this case, as well. The heat treatment conditions are not limited, but, in general, the aqueous polyimide precursor solution composition may be preferably heated at a temperature of 100° C. or higher, preferably from 120° C. to 600° C., more preferably from 150° C. to 500° C., for from 0.01 hours to 30 hours, preferably from 0.01 hours to 10 hours.

As for the properties of the polyimide obtained from the binder resin composition for electrodes of the present invention, the binder resin composition for electrodes may be heated at a relatively low temperature (for example, 150° C. to 300° C., preferably 180° C. to 250° C.) to provide a polyimide, which has excellent properties, for example, high adhesiveness to a metal, and is in no way inferior to a polyimide obtained from a commonly-used binder resin composition for electrodes comprising an organic solvent.

The binder resin composition for electrodes of the present invention may be suitably used as a binder resin composition for batteries, because the polyimide resin, which is obtained by the heat treatment as described above, preferably has a weight increase of 3 wt % or less, more preferably 2 wt % or less, further preferably 1 wt % or less, when immersed in dimethyl carbonate for 24 hours at a temperature of 25° C. Here dimethyl carbonate is a compound commonly used as an electrolyte component of a battery, and when the weight increase in a liquid electrolyte (rate of swelling when immersed in the liquid electrolyte for 24 hours at a temperature of 25° C.) of the binder resin, which is caused by swelling by the liquid electrolyte, is 5 wt % or less, more preferably 3 wt % or less, particularly preferably 2 wt % or less, the influence of the volume change of the electrode may be suitably reduced.

In addition, lithium methoxide is often formed in a battery environment. The polyimide resin obtained from the binder resin composition for electrodes of the present invention preferably has a weight increase in a liquid electrolyte containing lithium methoxide (rate of swelling when immersed in the liquid electrolyte for 24 hours at a temperature of 25° C.) of 5 wt % or less, more preferably 3 wt % or less, particularly preferably 2 wt % or less.

An electrode mixture paste may be suitably prepared by mixing the binder resin composition for electrodes of the present invention with at least an electrode active material, preferably, but not limited to, at a temperature of from 10° C. to 60° C. Any known electrode active material may be suitably used, and a lithium-containing metal composite oxide, a carbon powder, a silicon powder, a tin powder, and a silicon-containing or tin-containing alloy powder may be more preferred. The amount of the electrode active material in the electrode mixture paste may be generally, but not limited to, from 0.1 to 1000 times, preferably from 1 to 1000 times, more preferably from 5 to 1000 times, further preferably from 10 to 1000 times, the weight of the solid content based on the polyamic acid on a weight basis. When the amount of the electrode active material is too small, the greater part of the active material layer formed on a current collector may be inactive, resulting in the inadequate function of the electrode. When the amount of the electrode active material is too large, the electrode active material may not be firmly bound to a current collector and may be readily detached. In addition, the electrode mixture paste may contain an additive such as a surfactant, a viscosity modifier, and a conductive auxiliary agent, as necessary. The solid content of the polyamic acid may be preferably from 1 wt % to 15 wt %, relative to the whole solid content in the electrode mixture paste. When the solid content of the polyamic acid is outside the above-mentioned range, the performance of the electrode may be degraded.

An electrode may be produced by flow-casting or applying an electrode mixture paste onto a conductive current collector such as aluminum, wherein the electrode mixture paste comprises the binder resin composition for electrodes of the present invention, and an electrode active material which is capable of reversibly incorporating and releasing lithium ion on charge and discharge, for example, a lithium-containing metal composite oxide; and then heating the electrode mixture paste at a temperature of from 80° C. to 400° C., more preferably from 120° C. to 300° C., particularly preferably from 150° C. to 250° C., to remove a solvent and effect imidization.

When the heating temperature is outside the above-mentioned range, the imidization reaction may not sufficiently proceed, and the properties of the formed electrode may be degraded. The heat treatment may be performed in multiple steps so as to prevent foaming and powdering. Additionally, the heating time is preferably from 3 minutes to 48 hours. The heating time longer than 48 hours is not preferred in terms of productivity. The heating time shorter than 3 minutes is not preferred because the imidization reaction, and the removal of the solvent may not sufficiently proceed.

The electrode thus obtained may be particularly suitably used as a positive electrode of a lithium ion secondary battery.

An electrode may be produced by flow-casting or applying an electrode mixture paste onto a conductive current collector such as copper, wherein the electrode mixture paste comprises the binder resin composition for electrodes of the present invention, and an electrode active material which is capable of reversibly incorporating and releasing lithium ion on charge and discharge, for example, a carbon powder, a silicon powder, a tin powder, or a silicon-containing or tin-containing alloy powder; and then heating the electrode mixture paste at a temperature of from 80° C. to 300° C., more preferably from 120° C. to 280° C., particularly preferably from 150° C. to 250° C., to remove a solvent and effect imidization.

When the heating temperature is lower than 80° C., the imidization reaction may not sufficiently proceed, and the properties of the formed electrode may be degraded. When the electrode mixture paste is heated at a temperature higher than 300° C., copper may deform, and therefore the product may not be used as an electrode. The heat treatment may be performed in multiple steps so as to prevent foaming and powdering, in this case, as well. Additionally, the heating time is preferably from 3 minutes to 48 hours. The heating time longer than 48 hours is not preferred in terms of productivity. The heating time shorter than 3 minutes is not preferred because the imidization reaction, and the removal of the solvent may not sufficiently proceed.

The electrode thus obtained may be particularly suitably used as a negative electrode of a lithium ion secondary battery.

The aqueous polyimide precursor solution composition of the present invention may also be suitably used as a polyimide precursor resin composition for flexible device substrates.

According to the method for producing the flexible device of the present invention, a coating film of an aqueous polyimide precursor solution composition layer is formed on a substrate by applying or spraying an aqueous polyimide precursor solution composition (specifically, an aqueous polyimide precursor solution composition in which a polyamic acid consisting of a repeating unit represented by the formula (1) is homogeneously dissolved in an aqueous solvent together with an imidazole in an amount of 1.6 mole or more per mole of the tetracarboxylic acid component of the polyamic acid) onto the substrate surface, and then the aqueous polyimide precursor solution composition is heated to provide a polyimide substrate for flexible devices.

According to the present invention, a polyimide substrate for flexible devices may be suitably prepared by heating the aqueous polyimide precursor solution composition to remove an aqueous solvent and effect imidization (dehydration/ring closure). The heat treatment conditions are not limited, but, in general, the aqueous polyimide precursor solution composition may be preferably heated at a temperature of 100° C. or higher, preferably from 120° C. to 600° C., more preferably from 150° C. to 500° C., further preferably from 150° C. to 350° C., for from 0.01 hours to 30 hours, preferably from 0.01 hours to 10 hours, preferably while increasing the temperature stepwise.

The heat treatment may be suitably performed under atmospheric pressure, and may be performed under reduced pressure so as to efficiently remove the aqueous solvent. The aqueous polyimide precursor solution composition may be heated at a relatively low temperature under reduced pressure at the early stage for deaeration. When the heating temperature is rapidly increased, a problem such as foaming may occur, and therefore a good flexible device substrate may not be obtained.

According to the method for producing the polyimide substrate for flexible devices of the present invention, the aqueous polyimide precursor solution composition may be heated at a relatively low temperature (for example, 150° C. to 300° C., preferably 180° C. to 250° C.) to readily provide a polyimide substrate for flexible devices, which has excellent properties, and is in no way inferior to a polyimide substrate obtained from a commonly-used polyimide precursor (polyamic acid) solution composition comprising an organic solvent.

According to the method for producing the flexible device of the present invention, a solid polyimide resin film is formed on a carrier substrate as a support by applying a polyimide precursor resin composition (aqueous polyimide precursor solution composition) onto the carrier substrate, and heating the composition; a circuit is formed on the polyimide resin film; and then the polyimide resin film on which the circuit is formed is separated from the carrier substrate.

Any method for applying an aqueous polyimide precursor solution composition may be applied, as long as a coating film having a uniform thickness is formed on a carrier substrate (support). For example, die coating, spin coating, and screen printing may be employed for the application.

A substrate for flexible devices may be suitably produced by a method, comprising forming a coating film of an aqueous polyimide precursor solution composition on a carrier substrate;

heating the coating film at a relatively low temperature to effect the removal of the aqueous solvent, thereby forming a self-supporting film (the film in a state of not flowing; the polymerization and partial imidization reaction, as well as the removal of the aqueous solvent, proceed); and heating the self-supporting film on the substrate, or alternatively, the self-supporting film which is peeled from the substrate, if necessary, to effect dehydration/imidization.

The terms "removal of the aqueous solvent" and "dehydration/imidization" as used herein do not mean that only the removal of the aqueous solvent proceeds and only the dehydration/imidization proceeds, respectively, in the steps. In the aqueous solvent removal step, the dehydration/imidization proceeds to some extent. In the dehydration/imidization step, the removal of the residual aqueous solvent proceeds.

The aqueous polyimide precursor solution composition of the present invention may contain other additive component(s) depending on the intended application of the polyimide substrate for flexible devices obtained. Additionally, another resin layer may be laminated on the polyimide substrate for flexible devices obtained.

In the method for producing the flexible device of the present invention, the thickness of the polyimide resin film is desirably from 1 μm to 20 μm. When the thickness is less than 1 μm, the polyimide resin film may not remain adequately resistant, and therefore the polyimide resin film may not withstand stress and may be broken when used as a flexible device substrate. When the thickness of the polyimide resin film is more than 20 μm and greater, it may be difficult to achieve the thinning of the flexible device. The thickness of the polyimide resin film is more desirably from 2 μm to 10 μm so as to achieve the further thinning, while maintaining an adequate resistance for the flexible device.

According to the method for producing the flexible device of the present invention, a circuit needed for a display device or a light-receiving device is formed on the polyimide resin film formed as described above. This step differs from device to device. For example, in the case of the production of a TFT liquid crystal display device, a TFT of amorphous silicon, for example, is formed on the polyimide resin film. The TFT comprises a gate metal layer, a silicon nitride gate dielectric layer, and an ITI pixel electrode. In addition, a structure needed for a liquid crystal display may be formed thereon by a known method. The method for forming a circuit, and the like is not limited because the polyimide resin film obtained according to the present invention has excellent properties such as heat resistance, and toughness.

The polyimide resin film on which the circuit etc. is formed as described above is separated from the carrier substrate. The method for the separation is not limited. For example, the polyimide resin film on which the circuit is formed may be separated from the carrier substrate by irradiation with laser or the like from the carrier substrate side. Because the polyimide resin film obtained according to the present invention has high flexibility and toughness, it may be physically separated from the carrier substrate (support) simply.

Examples of the flexible device in the present invention include display devices such as a liquid crystal display, an organic EL display and an electronic paper, and light-receiving devices such as a solar cell and CMOS. The present invention may be particularly suitably applied to devices to be thinner and flexible.

EXAMPLES

Hereinafter, the present invention will be more specifically described with reference to Examples and Comparative Examples, but the present invention is not limited to these Examples.

The methods for measuring the properties, which was used in the following examples, will be described below.

<Solid Content>

A sample solution (the weight is referred to as "w1") was heated at 120° C. for 10 minutes, 250° C. for 10 minutes, and then 350° C. for 30 minutes in a hot air dryer, and the weight of the sample after the heat treatment (the weight is referred to as "w2") was measured. The solid content [wt %] was calculated by the following formula.

Solid content [wt %]=$(w2/w1) \times 100$

<Inherent Viscosity>

A sample solution was diluted to a concentration of 0.5 g/dl based on the solid content (the solvent:water). The flowing time ($T_1$) of the diluted solution was measured at 30° C. using a Cannon-Fenske viscometer No. 100. The inherent viscosity was calculated by the following formula using the flowing time ($T_0$) of the blank water.

Inherent viscosity=$\{\ln(T_1/T_0)\}/0.5$

<Solution Viscosity (Rotational Viscosity)>

The solution viscosity was measured at 30° C. using an E type viscometer manufactured by Tokimec, Inc.

<Preparation of Sample of Polyimide Film>

An aqueous polyimide precursor solution composition obtained was applied on a glass plate as a substrate with a bar coater. The resulting coating film was deaerated and predried at 25° C. for 30 minutes under reduced pressure. Subsequently, the predried coating film was placed into a hot air dryer and heated at 80° C. for 30 minutes, and then 200° C. for 1 hour under atmospheric pressure, to provide a polyimide film having a thickness of 25 μm. The properties of the polyimide film were evaluated.

<Mechanical Properties (Tensile Test)>

The tensile test was performed in accordance with ASTM D882 using a tensile tester (RTC-1225A, manufactured by Orientec Co., Ltd.) to determine the tensile elastic modulus, tensile elongation at break, and tensile strength at break.

<Evaluation of Flexibility (Bendability)>

The 180° folding test was performed, and an article in which no crack appeared in the polyimide film was evaluated as ◯, and an article in which a crack appeared in the polyimide film was evaluated as x.

<Production of Polyimide Seamless Belt>

An aqueous polyimide precursor solution composition was uniformly applied on the inner surface of a cylindrical mold having an inside diameter of 150 mm and a length of 300 mm, while rotating the mold at 100 rpm. Subsequently, the resulting coating film was heated at 80° C. for 30 minutes, and then 200° C. for 1 hour, while rotating the mold at 200 rpm, to provide a polyimide seamless belt having a thickness of 50 μm.

The state of the seamless belt obtained was visually observed. Additionally, the properties of the polyimide seamless belt were evaluated.

<Observation of State of Polyimide Seamless Belt>

An article in which no defects such as foaming and crack were observed was evaluated as ◯, and an article in which defects such as foaming and crack were observed in not less than 30% of the whole area was evaluated as x.

<Flexibility Test on Polyimide Seamless Belt>

The polyimide seamless belt sample obtained from the aqueous polyimide precursor solution composition and having a thickness of 50 μm was cut into a 10 mm×50 mm rectangle. The 180° folding test was repeated, and the number of times the 180° folding test was repeated until a crack appeared was determined.

<Preparation of Sample of Binder Polyimide Film for Electrodes>

A binder resin composition for electrodes obtained was applied on a glass plate as a substrate with a bar coater. The resulting coating film was deaerated and predried at 25° C. for 30 minutes under reduced pressure. Subsequently, the predried coating film was placed into a hot air dryer and heated at 80° C. for 30 minutes, and then 200° C. for 1 hour under atmospheric pressure, to provide a polyimide film having a thickness of 25 μm. The properties of the polyimide film were evaluated.

<Swelling Test>

The polyimide film obtained from the binder resin composition for electrodes was cut into a 5 cm square (thickness: 25 μm), which was used as a sample. The sample was dried at 60° C. for 24 hours under vacuum, and the weight of the sample was defined as "dry weight (Wd)". The sample was immersed in a dimethyl carbonate (DMC) solution or a 10 wt % lithium methoxide methanol solution at 25° C. for 24 hours, and the weight of the sample was defined as "wet weight (Ww)". The "swelling rate (S)" was calculated by the following formula.

$S$[wt %]=$(Ww-Wd)/Ww \times 100$

<Observation of State of Flexible Device Substrate>

An article in which no defects such as foaming and crack were observed was evaluated as ◯, and an article in which defects such as foaming and crack were observed in more than 30% of the whole area was evaluated as x.

The abbreviations of the compounds used in the following examples are as follows:

s-BPDA: 3,3',4,4'-biphenyltetracarboxylic dianhydride
ODPA: 4,4'-oxydiphthalic dianhydride
t-DCDA: trans-dicyclohexyl-3,3',4,4'-tetracarboxylic dianhydride
H-PMDA: 1,2,4,5-cyclohexane tetracarboxylic-1,2:4,5-dianhydride
6FDA: 4,4'-(hexafluoroisopropylidene)diphthalic anhydride
ODA: 4,4'-diaminodiphenyl ether (solubility in water at 25° C.: 0.19 g/L)
PPD: p-phenylenediamine (solubility in water at 25° C.: 120 g/L)
t-CHDA: trans-1,4-diaminocyclohexane (solubility in water at 25° C.: 1000 g/L, molecular weight: 114)
HMD: 1,6-hexamethylene diamine (solubility in water at 25° C.: 1000 g/L, molecular weight: 116)
DMD: 1,10-decamethylene diamine (solubility in water at 25° C.: 1000 g/L, molecular weight: 172)
D400: JEFFAMINE D400 (manufactured by Mitsui Chemicals, Inc., diamine compound having a weight average molecular weight of 435)

D2000: JEFFAMINE D2000 (manufactured by Mitsui Chemicals, Inc., diamine compound having a weight average molecular weight of 2041)
1074: PRIAMINE 1074 (manufactured by Croda Japan KK, diamine compound having a weight average molecular weight of 548)
1,2-DMZ: 1,2-dimethylimidazole (solubility in water at 25° C.: 239 g/L)
NMP: N-methyl-2-pyrrolidone

Example A1

In a 500 mL (internal volume) glass reaction vessel equipped with a stirrer and a nitrogen-gas charging/discharge tube was placed 400 g of water as a solvent. And then, 16.03 g (0.148 mol) of PPD and 11.29 g (0.099 mol) of t-CHDA, and 59.38 g (1.25 equivalents per carboxyl group) of 1,2-DMZ were added thereto, and the mixture was stirred at 25° C. for 1 hour to dissolve these compounds in water. Subsequently, 72.68 g (0.247 mol) of s-BPDA was added to the resulting solution, and the mixture was stirred at 70° C. for 6 hours to provide an aqueous polyimide precursor solution having a solid content of 16.7 wt %, a solution viscosity of 27.2 Pa·s, and an inherent viscosity of 1.04.

The properties of the aqueous polyimide precursor solution composition and the polyimide film obtained are shown in Table 1.

Example A2

In a 500 mL (internal volume) glass reaction vessel equipped with a stirrer and a nitrogen-gas charging/discharge tube was placed 400 g of water as a solvent. And then, 21.63 g (0.108 mol) of ODA and 7.98 g (0.046 mol) of DMD, and 37.09 g (1.25 equivalents per carboxyl group) of 1,2-DMZ were added thereto, and the mixture was stirred at 25° C. for 1 hour to dissolve these compounds in water. Subsequently, 45.40 g (0.154 mol) of s-BPDA was added to the resulting solution, and the mixture was stirred at 70° C. for 6 hours to provide an aqueous polyimide precursor solution having a solid content of 13.0 wt %, a solution viscosity of 54.5 Pa·s, and an inherent viscosity of 0.28.

The properties of the aqueous polyimide precursor solution composition and the polyimide film obtained are shown in Table 1.

Example A3

In a 500 mL (internal volume) glass reaction vessel equipped with a stirrer and a nitrogen-gas charging/discharge tube was placed 400 g of water as a solvent. And then, 17.96 g (0.166 mol) of PPD and 12.26 g (0.071 mol) of DMD, and 57.01 g (1.25 equivalents per carboxyl group) of 1,2-DMZ were added thereto, and the mixture was stirred at 25° C. for 1 hour to dissolve these compounds in water. Subsequently, 69.78 g (0.237 mol) of s-BPDA was added to the resulting solution, and the mixture was stirred at 70° C. for 6 hours to provide an aqueous polyimide precursor solution having a solid content of 16.2 wt %, a solution viscosity of 30.8 Pa·s, and an inherent viscosity of 0.86.

The properties of the aqueous polyimide precursor solution composition and the polyimide film obtained are shown in Table 1.

Example A4

In a 500 mL (internal volume) glass reaction vessel equipped with a stirrer and a nitrogen-gas charging/discharge tube was placed 400 g of water as a solvent. And then, 22.21 g (0.111 mol) of ODA, 4.80 g (0.044 mol) of PPD and 7.73 g (0.067 mol) of HMD, and 53.32 g (1.25 equivalents per carboxyl group) of 1,2-DMZ were added thereto, and the mixture was stirred at 25° C. for 1 hour to dissolve these compounds in water. Subsequently, 65.26 g (0.222 mol) of s-BPDA was added to the resulting solution, and the mixture was stirred at 70° C. for 6 hours to provide an aqueous polyimide precursor solution having a solid content of 16.7 wt %, a solution viscosity of 20.7 Pa·s, and an inherent viscosity of 0.38.

The properties of the aqueous polyimide precursor solution composition and the polyimide film obtained are shown in Table 1.

Example A5

In a 500 mL (internal volume) glass reaction vessel equipped with a stirrer and a nitrogen-gas charging/discharge tube was placed 400 g of water as a solvent. And then, 18.70 g (0.173 mol) of PPD and 8.61 g (0.074 mol) of HMD, and 59.38 g (1.25 equivalents per carboxyl group) of 1,2-DMZ were added thereto, and the mixture was stirred at 25° C. for 1 hour to dissolve these compounds in water. Subsequently, 72.68 g (0.247 mol) of s-BPDA was added to the resulting solution, and the mixture was stirred at 70° C. for 6 hours to provide an aqueous polyimide precursor solution having a solid content of 16.1 wt %, a solution viscosity of 30.2 Pa·s, and an inherent viscosity of 0.82.

The properties of the aqueous polyimide precursor solution composition and the polyimide film obtained are shown in Table 1.

Example A6

In a 500 mL (internal volume) glass reaction vessel equipped with a stirrer and a nitrogen-gas charging/discharge tube was placed 425 g of water as a solvent. And then, 19.42 g (0.097 mol) of ODA, 3.50 g (0.032 mol) of PPD and 3.76 g (0.032 mol) of HMD, and 38.85 g (1.25 equivalents per carboxyl group) of 1,2-DMZ were added thereto, and the mixture was stirred at 25° C. for 1 hour to dissolve these compounds in water. Subsequently, 33.29 g (0.113 mol) of s-BPDA and 15.04 g (0.048 mol) of ODPA was added to the resulting solution, and the mixture was stirred at 70° C. for 6 hours to provide an aqueous polyimide precursor solution having a solid content of 13.1 wt %, a solution viscosity of 54.8 Pa·s, and an inherent viscosity of 0.46.

The properties of the aqueous polyimide precursor solution composition and the polyimide film obtained are shown in Table 1.

Example A7

In a 500 mL (internal volume) glass reaction vessel equipped with a stirrer and a nitrogen-gas charging/discharge tube was placed 425 g of water as a solvent. And then, 19.29 g (0.096 mol) of ODA, 3.47 g (0.032 mol) of PPD and 3.73 g (0.032 mol) of HMD, and 38.58 g (1.25 equivalents per carboxyl group) of 1,2-DMZ were added thereto, and the mixture was stirred at 25° C. for 1 hour to dissolve these compounds in water. Subsequently, 23.61 g (0.080 mol) of s-BPDA and 24.90 g (0.080 mol) of ODPA was added to the resulting solution, and the mixture was stirred at 70° C. for 6 hours to provide an aqueous polyimide precursor solution having a solid content of 13.0 wt %, a solution viscosity of 20.1 Pa·s, and an inherent viscosity of 0.42.

The properties of the aqueous polyimide precursor solution composition and the polyimide film obtained are shown in Table 1.

Example A8

In a 500 mL (internal volume) glass reaction vessel equipped with a stirrer and a nitrogen-gas charging/discharge tube was placed 400 g of water as a solvent. And then, 26.10 g (0.130 mol) of ODA and 6.30 g (0.014 mol) of JEFFAMINE D400, and 34.81 g (1.25 equivalents per carboxyl group) of 1,2-DMZ were added thereto, and the mixture was stirred at 25° C. for 1 hour to dissolve these compounds in water. Subsequently, 42.61 g (0.145 mol) of s-BPDA was added to the resulting solution, and the mixture was stirred at 70° C. for 6 hours to provide an aqueous polyimide precursor solution having a solid content of 12.4 wt %, a solution viscosity of 38.7 Pa·s, and an inherent viscosity of 0.27.

The properties of the aqueous polyimide precursor solution composition and the polyimide film obtained are shown in Table 1.

Example A9

In a 500 mL (internal volume) glass reaction vessel equipped with a stirrer and a nitrogen-gas charging/discharge tube was placed 400 g of water as a solvent. And then, 26.64 g (0.246 mol) of PPD, and 59.20 g (1.25 equivalents per carboxyl group) of 1,2-DMZ were added thereto, and the mixture was stirred at 25° C. for 1 hour to dissolve these compounds in water. Subsequently, 50.73 g (0.172 mol) of s-BPDA and 22.63 g (0.074 mol) of t-DCDA was added to the resulting solution, and the mixture was stirred at 70° C. for 6 hours to provide an aqueous polyimide precursor solution having a solid content of 16.2 wt %, a solution viscosity of 107.5 Pa·s, and an inherent viscosity of 0.87.

The properties of the aqueous polyimide precursor solution composition and the polyimide film obtained are shown in Table 1.

Example A10

In a 500 mL (internal volume) glass reaction vessel equipped with a stirrer and a nitrogen-gas charging/discharge tube was placed 400 g of water as a solvent. And then, 28.36 g (0.262 mol) of PPD, and 63.03 g (1.25 equivalents per carboxyl group) of 1,2-DMZ were added thereto, and the mixture was stirred at 25° C. for 1 hour to dissolve these compounds in water. Subsequently, 54.00 g (0.184 mol) of s-BPDA and 17.63 g (0.079 mol) of H-PMDA was added to the resulting solution, and the mixture was stirred at 70° C. for 6 hours to provide an aqueous polyimide precursor solution having a solid content of 16.5 wt %, a solution viscosity of 8.7 Pa·s, and an inherent viscosity of 0.60.

The properties of the aqueous polyimide precursor solution composition and the polyimide film obtained are shown in Table 1.

Example A11

In a 500 mL (internal volume) glass reaction vessel equipped with a stirrer and a nitrogen-gas charging/discharge tube was placed 425 g of water as a solvent. And then, 20.47 g (0.102 mol) of ODA and 5.00 g (0.044 mol) of t-CHDA, and 35.10 g (1.25 equivalents per carboxyl group) of 1,2-DMZ were added thereto, and the mixture was stirred at 25° C. for 1 hour to dissolve these compounds in water. Subsequently, 30.07 g (0.102 mol) of s-BPDA and 19.46 g (0.044 mol) of 6FDA was added to the resulting solution, and the mixture was stirred at 70° C. for 6 hours to provide an aqueous polyimide precursor solution having a solid content of 13.2 wt %, a solution viscosity of 5.3 Pa·s, and an inherent viscosity of 0.35.

The properties of the aqueous polyimide precursor solution composition and the polyimide film obtained are shown in Table 1-2.

Example A12

In a 500 mL (internal volume) glass reaction vessel equipped with a stirrer and a nitrogen-gas charging/discharge tube was placed 425 g of water as a solvent. And then, 20.54 g (0.102 mol) of ODA and 4.75 g (0.044 mol) of PPD, and 35.10 g (1.25 equivalents per carboxyl group) of 1,2-DMZ were added thereto, and the mixture was stirred at 25° C. for 1 hour to dissolve these compounds in water. Subsequently, 30.18 g (0.102 mol) of s-BPDA and 19.53 g (0.044 mol) of 6FDA was added to the resulting solution, and the mixture was stirred at 70° C. for 6 hours to provide an aqueous polyimide precursor solution having a solid content of 13.1 wt %, a solution viscosity of 7.5 Pa·s, and an inherent viscosity of 0.42.

The properties of the aqueous polyimide precursor solution composition and the polyimide film obtained are shown in Table 1-2.

Reference Example A1

In a 500 mL (internal volume) glass reaction vessel equipped with a stirrer and a nitrogen-gas charging/discharge tube was placed 400 g of water as a solvent. And then, 9.37 g (0.047 mol) of ODA and 21.76 g (0.187 mol) of HMD, and 56.26 g (1.25 equivalents per carboxyl group) of 1,2-DMZ were added thereto, and the mixture was stirred at 25° C. for 1 hour to dissolve these compounds in water. Subsequently, 68.87 g (0.234 mol) of s-BPDA was added to the resulting solution, and the mixture was stirred at 70° C. for 6 hours to provide an aqueous polyimide precursor solution having a solid content of 16.0 wt %, a solution viscosity of 0.7 Pa·s, and an inherent viscosity of 0.72.

The properties of the aqueous polyimide precursor solution composition and the polyimide film obtained are shown in Table 2.

Reference Example A2

In a 500 mL (internal volume) glass reaction vessel equipped with a stirrer and a nitrogen-gas charging/discharge tube was placed 400 g of water as a solvent. And then, 5.29 g (0.049 mol) of PPD and 22.74 g (0.196 mol) of HMD, and 58.80 g (1.25 equivalents per carboxyl group) of 1,2-DMZ were added thereto, and the mixture was stirred at 25° C. for 1 hour to dissolve these compounds in water. Subsequently, 71.97 g (0.245 mol) of s-BPDA was added to the resulting solution, and the mixture was stirred at 70° C. for 6 hours to provide an aqueous polyimide precursor solution having a solid content of 15.7 wt %, a solution viscosity of 1.4 Pa·s, and an inherent viscosity of 0.86.

The properties of the aqueous polyimide precursor solution composition and the polyimide film obtained are shown in Table 2.

Comparative Example A1

In a 500 mL (internal volume) glass reaction vessel equipped with a stirrer and a nitrogen-gas charging/discharge tube was placed 400 g of water as a solvent. And then, 26.56 g (0.133 mol) of ODA and 30.08 g (0.015 mol) of JEFFAMINE D2000, and 35.43 g (1.25 equivalents per carboxyl group) of 1,2-DMZ were added thereto, and the mixture was stirred at 25° C. for 1 hour to dissolve these compounds in water. Subsequently, 43.36 g (0.147 mol) of s-BPDA was added to the resulting solution, and the mixture was stirred at 70° C. for 6 hours. Still, s-BPDA was not dissolved therein homogeneously, and an aqueous polyimide precursor solution composition could not be obtained.

The results are shown in Table 2.

Comparative Example A2

In a 500 mL (internal volume) glass reaction vessel equipped with a stirrer and a nitrogen-gas charging/discharge tube was placed 400 g of water as a solvent. And then, 34.06 g (0.170 mol) of ODA and 10.34 g (0.019 mol) of PRIAMINE 1074, and 45.42 g (1.25 equivalents per carboxyl group) of 1,2-DMZ were added thereto, and the mixture was stirred at 25° C. for 1 hour to dissolve these compounds in water. Subsequently, 55.60 g (0.189 mol) of s-BPDA was added to the resulting solution, and the mixture was stirred at 70° C. for 6 hours. Still, s-BPDA was not dissolved therein homogeneously, and an aqueous polyimide precursor solution composition could not be obtained.

The results are shown in Table 2.

TABLE 1

| | | Example A1 | Example A2 | Example A3 | Example A4 | Example A5 |
|---|---|---|---|---|---|---|
| Composition of aqueous polyimide precursor solution | | | | | | |
| acid component | s-BPDA (mol %) | 100 | 100 | 100 | 100 | 100 |
| | ODPA (mol %) | | | | | |
| | t-DCDA (mol %) | | | | | |
| | H-PMDA (mol %) | | | | | |
| diamine component | ODA (mol %) | | 70 | | 50 | |
| | PPD (mol %) | 60 | | 70 | 20 | 70 |
| | t-CHDA (mol %) | 40 | | | | |
| | DMD (mol %) | | 30 | 30 | | |
| | HMD (mol %) | | | | 30 | 30 |
| | D400 (mol %) | | | | | |
| imidazole | 1,2-DMZ (equivalents) | 1.25 | 1.25 | 1.25 | 1.25 | 1.25 |
| Aqueous polyimide precursor solution | | | | | | |
| | polymerization temperature | 70 | 70 | 70 | 70 | 70 |
| | polymerization time | 6 | 6 | 6 | 6 | 6 |
| | inherent viscosity | 1.04 | 0.28 | 0.86 | 0.38 | 0.82 |
| | solid content (wt %) | 16.7 | 13.0 | 16.2 | 16.7 | 16.1 |
| | solution viscosity (Pa · s) | 27.2 | 54.5 | 30.8 | 20.7 | 30.2 |
| Properties of polyimide | | | | | | |
| | evaluation of flexibility | ◯ | ◯ | ◯ | ◯ | ◯ |
| | tensile elastic modulus (GPa) | 5.2 | 3.0 | 4.1 | 2.8 | 4.9 |
| | tensile elongation at break (%) | 20 | 27 | 25 | 38 | 41 |
| | tensile strength at break (MPa) | 180 | 124 | 133 | 135 | 167 |
| | | Example A6 | Example A7 | Example A8 | Example A9 | Example A10 |
| Composition of aqueous polyimide precursor solution | | | | | | |
| acid component | s-BPDA (mol %) | 70 | 50 | 100 | 70 | 70 |
| | ODPA (mol %) | 30 | 50 | | | |
| | t-DCDA (mol %) | | | | 30 | |
| | H-PMDA (mol %) | | | | | 30 |
| diamine component | ODA (mol %) | 60 | 60 | 90 | | |
| | PPD (mol %) | 20 | 20 | | 100 | 100 |
| | t-CHDA (mol %) | | | | | |
| | DMD (mol %) | | | | | |
| | HMD (mol %) | 20 | 20 | | | |
| | D400 (mol %) | | | 10 | | |
| imidazole | 1,2-DMZ (equivalents) | 1.25 | 1.25 | 1.25 | 1.25 | 1.25 |
| Aqueous polyimide precursor solution | | | | | | |
| | polymerization temperature | 70 | 70 | 70 | 70 | 70 |
| | polymerization time | 6 | 6 | 6 | 6 | 6 |
| | inherent viscosity | 0.46 | 0.42 | 0.27 | 0.87 | 0.60 |
| | solid content (wt %) | 13.1 | 13.0 | 12.4 | 16.2 | 16.5 |
| | solution viscosity (Pa · s) | 54.8 | 20.1 | 38.7 | 107.5 | 8.7 |

TABLE 1-continued

| Properties of polyimide | | | | | |
|---|---|---|---|---|---|
| evaluation of flexibility | ○ | ○ | ○ | ○ | ○ |
| tensile elastic modulus (GPa) | 3.3 | 3.4 | 3.2 | 5.0 | 5.6 |
| tensile elongation at break (%) | 90 | 75 | 27 | 30 | 18 |
| tensile strength at break (MPa) | 156 | 152 | 127 | 145 | 208 |

TABLE 1-2

| | | Example A11 | Example A12 |
|---|---|---|---|
| Composition of aqueous polyimide precursor solution | | | |
| acid component | s-BPDA (mol %) | 70 | 70 |
| | ODPA (mol %) | | |
| | t-DCDA (mol %) | | |
| | H-PMDA (mol %) | | |
| | 6FDA (mol %) | 30 | 30 |
| diamine component | ODA (mol %) | 70 | 70 |
| | PPD (mol %) | | 30 |
| | t-CHDA (mol %) | 30 | |
| | DMD (mol %) | | |
| | HMD (mol %) | | |
| | D400 (mol %) | | |
| imidazole | 1,2-DMZ (equivalents) | 1.25 | 1.25 |
| Aqueous polyimide precursor solution | | | |
| | polymerization temperature | 70 | 70 |
| | polymerization time | 6 | 6 |
| | inherent viscosity | 0.35 | 0.42 |
| | solid content (wt %) | 13.2 | 13.1 |
| | solution viscosity (Pa · s) | 5.3 | 7.5 |
| Properties of polyimide | | | |
| | evaluation of flexibility | ○ | ○ |
| | tensile elastic modulus (GPa) | 2.9 | 3.3 |
| | tensile elongation at break (%) | 28 | 42 |
| | tensile strength at break (MPa) | 124 | 139 |

Example B1

A polyimide seamless belt was prepared from the aqueous polyimide precursor solution composition obtained in Example A1, as described in <Production of Polyimide Seamless Belt> section.

The results of the state observations and the properties evaluations of the aqueous polyimide precursor solution composition and the polyimide seamless belt obtained are shown in Table 3.

Example B2

A polyimide seamless belt was prepared from the aqueous polyimide precursor solution composition obtained in Example A4, as described in <Production of Polyimide Seamless Belt> section.

The results of the state observations and the properties evaluations of the aqueous polyimide precursor solution composition and the polyimide seamless belt obtained are shown in Table 3.

Example B3

A polyimide seamless belt was prepared from the aqueous polyimide precursor solution composition obtained in Example A6, as described in <Production of Polyimide Seamless Belt> section.

The results of the state observations and the properties evaluations of the aqueous polyimide precursor solution composition and the polyimide seamless belt obtained are shown in Table 3.

TABLE 2

| | | Reference Example A1 | Reference Example A2 | Comparative Example A1 | Comparative Example A2 |
|---|---|---|---|---|---|
| Composition of aqueous polyimide precursor solution | | | | | |
| acid component | s-BPDA (mol %) | 100 | 100 | 100 | 100 |
| diamine component | ODA (mol %) | 20 | | 90 | 90 |
| | PPD (mol %) | | 20 | | |
| | HMD (mol %) | 80 | 80 | | |
| | D2000 (mol %) | | | 10 | |
| | 1074 (mol %) | | | | 10 |
| imidazole | 1,2-DMZ (equivalents) | 1.25 | 1.25 | 1.25 | 1.25 |
| Aqueous polyimide precursor solution | | | | | |
| | polymerization temperature | 70 | 70 | 70 | 70 |
| | polymerization time | 6 | 6 | 6 | 6 |
| | inherent viscosity | 0.72 | 0.86 | Aqueous polyimide precursor solution could not be obtained. (not homogeneously dissolved) | |
| | solid content (wt %) | 16.0 | 15.7 | | |
| | solution viscosity (Pa · s) | 0.7 | 1.4 | | |
| Properties of polyimide | | | | | |
| | tensile elastic modulus (GPa) | 3.0 | 2.8 | | |
| | tensile elongation at break (%) | 17 | 27 | | |
| | tensile strength at break (MPa) | 110 | 102 | | |

Example B4

A polyimide seamless belt was prepared from the aqueous polyimide precursor solution composition obtained in Example A7, as described in <Production of Polyimide Seamless Belt> section.

The results of the state observations and the properties evaluations of the aqueous polyimide precursor solution composition and the polyimide seamless belt obtained are shown in Table 3.

Reference Example B1

In a 500 mL (internal volume) glass reaction vessel equipped with a stirrer and a nitrogen-gas charging/discharge tube was placed 450 g of water as a solvent. And then, 20.25 g (0.101 mol) of ODA and 24.31 g (1.25 equivalents per carboxyl group) of 1,2-DMZ were added thereto, and the mixture was stirred at 25° C. for 1 hour to dissolve these compounds in water. Subsequently, 29.75 g (0.101 mol) of s-BPDA was added to the resulting solution, and the mixture was stirred at 70° C. for 4 hours to provide an aqueous polyimide precursor solution having a solid content of 8.7 wt %, a solution viscosity of 32.0 Pa·s, and an inherent viscosity of 0.42.

An aromatic polyimide seamless belt was prepared from the aqueous polyimide precursor solution composition, as described in <Production of Aromatic Polyimide Seamless Belt> section.

The results of the state observations and the properties evaluations of the aqueous polyimide precursor solution composition and the polyimide seamless belt obtained are shown in Table 3.

Reference Example B2

In a 500 mL (internal volume) glass reaction vessel equipped with a stirrer and a nitrogen-gas charging/discharge tube was placed 450 g of water as a solvent. And then, 14.86 g (0.074 mol) of ODA, 3.44 g (0.032 mol) of PPD and 20.43 g (1.25 equivalents per carboxyl group) of 1,2-DMZ were added thereto, and the mixture was stirred at 25° C. for 1 hour to dissolve these compounds in water. Subsequently, 21.83 g (0.074 mol) of s-BPDA and 9.87 g (0.032 mol) of ODPA were added to the resulting solution, and the mixture was stirred at 70° C. for 4 hours to provide an aqueous polyimide precursor solution composition having a solid content of 9.0 wt %, a solution viscosity of 5.2 Pa·s, and an inherent viscosity of 0.46.

An aromatic polyimide seamless belt was prepared from the aqueous polyimide precursor solution composition, as described in <Production of Aromatic Polyimide Seamless Belt> section.

The results of the state observations and the properties evaluations of the aqueous polyimide precursor solution composition and the polyimide seamless belt obtained are shown in Table 3.

TABLE 3

| | | Example B1 | Example B2 | Example B3 | Example B4 | Reference Example B1 | Reference Example B2 |
|---|---|---|---|---|---|---|---|
| Composition of aqueous polyimide precursor solution | | | | | | | |
| acid component | s-BPDA (mol %) | 100 | 100 | 70 | 50 | 100 | 70 |
| | ODPA (mol %) | | | 30 | 50 | | 30 |
| diamine component | ODA (mol %) | | 50 | 60 | 60 | 100 | 70 |
| | PPD (mol %) | 60 | 20 | 20 | 20 | | 30 |
| | t-CHDA (mol %) | 40 | | | | | |
| | HMD (mol %) | | 30 | 20 | 20 | | |
| imidazole | 1,2-DMZ (equivalents) | 1.25 | 1.25 | 1.25 | 1.25 | 1.25 | 1.25 |
| Aqueous polyimide precursor solution | | | | | | | |
| | polymerization temperature | 70 | 70 | 70 | 70 | 70 | 70 |
| | polymerization time | 6 | 6 | 6 | 6 | 4 | 4 |
| | inherent viscosity | 1.04 | 0.38 | 0.46 | 0.42 | 0.42 | 0.46 |
| | solid content (wt %) | 16.7 | 16.7 | 13.1 | 13.0 | 8.7 | 9.0 |
| | solution viscosity (Pa · s) | 27.2 | 20.7 | 54.8 | 20.1 | 32.0 | 5.2 |
| Polyimide seamless belt | | | | | | | |
| | state observation | ◯ | ◯ | ◯ | ◯ | ◯ | ◯ |
| | flexibility test (number of times) | 70 | 75 | 85 | 82 | 35 | 50 |
| | tensile elastic modulus (GPa) | 5.0 | 2.9 | 3.1 | 3.4 | 3.4 | 3.9 |
| | tensile elongation at break (%) | 18 | 32 | 75 | 68 | 28 | 27 |
| | tensile strength at break (MPa) | 178 | 128 | 145 | 142 | 160 | 154 |

Example C1

In a mortar, 4.79 g of the aqueous polyimide precursor solution composition (binder resin composition for electrodes) obtained in Example A2 (solid content after imidization: 0.8 g) and 9.2 g of 300 mesh silicon powder were ground and kneaded to provide an electrode mixture paste. The obtained paste was capable of being spread on a copper foil with a glass rod. The copper foil on which the paste was applied was fixed on a substrate, and heated at 120° C. for 1 hour, 200° C. for 10 minutes, 220° C. for 10 minutes, and then 250° C. for 10 minutes in a nitrogen atmosphere, to suitably provide an electrode having an active material layer thickness of 100 μm.

The properties of the binder resin composition for electrodes and the polyimide binder for electrodes obtained are shown in Table 4.

Example C2

An electrode was suitably prepared from the aqueous polyimide precursor solution composition (binder resin composition for electrodes) obtained in Example A4 in the same way as in Example C1.

The properties of the binder resin composition for electrodes and the polyimide binder for electrodes obtained are shown in Table 4.

Example C3

An electrode was suitably prepared from the aqueous polyimide precursor solution composition (binder resin composition for electrodes) obtained in Example A5 in the same way as in Example C1.

The properties of the binder resin composition for electrodes and the polyimide binder for electrodes obtained are shown in Table 4.

Example C4

An electrode was suitably prepared from the aqueous polyimide precursor solution composition (binder resin composition for electrodes) obtained in Example A6 in the same way as in Example C1.

The properties of the binder resin composition for electrodes and the polyimide binder for electrodes obtained are shown in Table 4.

Example C5

An electrode was suitably prepared from the aqueous polyimide precursor solution composition (binder resin composition for electrodes) obtained in Example A7 in the same way as in Example C1.

The properties of the binder resin composition for electrodes and the polyimide binder for electrodes obtained are shown in Table 4.

then 250° C. for 10 minutes under atmospheric pressure, to provide a polyimide film having a thickness of 10 μm.

The results of the state observations and the properties evaluations of the aqueous polyimide precursor solution composition and the polyimide substrate for flexible devices obtained are shown in Table 5.

Example D2

The aqueous polyimide precursor solution composition obtained in Example A5 was applied on a glass plate as a substrate with a bar coater. The resulting coating film was deaerated and predried at 25° C. for 30 minutes under reduced pressure. Subsequently, the predried coating film was placed into a hot air dryer and heated at 80° C. for 30 minutes, 120° C. for 30 minutes, 200° C. for 10 minutes, and then 250° C. for 10 minutes under atmospheric pressure, to provide a polyimide film having a thickness of 10 μm.

The results of the state observations and the properties evaluations of the aqueous polyimide precursor solution composition and the polyimide substrate for flexible devices obtained are shown in Table 5.

Example D3

The aqueous polyimide precursor solution composition obtained in Example A9 was applied on a glass plate as a substrate with a bar coater. The resulting coating film was deaerated and predried at 25° C. for 30 minutes under

TABLE 4

| | | Example C1 | Example C2 | Example C3 | Example C4 | Example C5 |
|---|---|---|---|---|---|---|
| Composition of binder resin composition for electrodes | | | | | | |
| acid component | s-BPDA (mol %) | 100 | 100 | 100 | 70 | 50 |
| | ODPA (mol %) | | | | 30 | 50 |
| diamine component | ODA (mol %) | 70 | 50 | | 60 | 60 |
| | PPD (mol %) | | 20 | 70 | 20 | 20 |
| | DMD (mol %) | 30 | | | | |
| | HMD (mol %) | | 30 | 30 | 20 | 20 |
| imidazole | 1,2-DMZ (equivalents) | 1.25 | 1.25 | 1.25 | 1.25 | 1.25 |
| Aqueous polyimide precursor solution | | | | | | |
| | polymerization temperature | 70 | 70 | 70 | 70 | 70 |
| | polymerization time | 6 | 6 | 6 | 6 | 6 |
| | inherent viscosity | 0.28 | 0.38 | 0.82 | 0.46 | 0.42 |
| | solid content (wt %) | 13.0 | 16.7 | 16.1 | 13.1 | 13.0 |
| | solution viscosity (Pa · s) | 54.5 | 20.7 | 30.2 | 54.8 | 20.1 |
| Properties of polyimide binder for electrodes | | | | | | |
| | tensile elastic modulus (GPa) | 3.0 | 2.8 | 4.9 | 3.3 | 3.4 |
| | tensile elongation at break (%) | 27 | 38 | 41 | 90 | 75 |
| | tensile strength at break (MPa) | 124 | 135 | 167 | 156 | 152 |
| | DMC swelling rate (%) | 0.8 | 0.3 | 0.5 | 0.1 | 0.2 |
| | lithium methoxide solution swelling rate (%) | 0.6 | 0.8 | 1.1 | 0.7 | 0.9 |

Example D1

The aqueous polyimide precursor solution composition obtained in Example A1 was applied on a glass plate as a substrate with a bar coater. The resulting coating film was deaerated and predried at 25° C. for 30 minutes under reduced pressure. Subsequently, the predried coating film was placed into a hot air dryer and heated at 80° C. for 30 minutes, 120° C. for 30 minutes, 200° C. for 10 minutes, and reduced pressure. Subsequently, the predried coating film was placed into a hot air dryer and heated at 80° C. for 30 minutes, 120° C. for 30 minutes, 200° C. for 10 minutes, and then 250° C. for 10 minutes under atmospheric pressure, to provide a polyimide film having a thickness of 10 μm.

The results of the state observations and the properties evaluations of the aqueous polyimide precursor solution composition and the polyimide substrate for flexible devices obtained are shown in Table 5.

Example D4

The aqueous polyimide precursor solution composition obtained in Example A10 was applied on a glass plate as a substrate with a bar coater. The resulting coating film was deaerated and predried at 25° C. for 30 minutes under reduced pressure. Subsequently, the predried coating film was placed into a hot air dryer and heated at 80° C. for 30 minutes, 120° C. for 30 minutes, 200° C. for 10 minutes, and then 250° C. for 10 minutes under atmospheric pressure, to provide a polyimide film having a thickness of 10 μm.

The results of the state observations and the properties evaluations of the aqueous polyimide precursor solution composition and the polyimide substrate for flexible devices obtained are shown in Table 5.

TABLE 5

|  |  | Example D1 | Example D2 | Example D3 | Example D4 |
|---|---|---|---|---|---|
| Composition of aqueous polyimide precursor solution |  |  |  |  |  |
| acid component | s-BPDA (mol %) | 100 | 100 | 70 | 70 |
|  | t-DCDA (mol %) |  |  | 30 |  |
|  | H-PMDA (mol %) |  |  |  | 30 |
| diamine component | PPD (mol %) | 60 | 70 | 100 | 100 |
|  | t-CHDA (mol %) | 40 |  |  |  |
|  | HMD (mol %) |  | 30 |  |  |
| imidazole | 1,2-DMZ (equivalents) | 1.25 | 1.25 | 1.25 | 1.25 |
| Aqueous polyimide precursor solution |  |  |  |  |  |
|  | polymerization temperature | 70 | 70 | 70 | 70 |
|  | polymerization time | 6 | 6 | 6 | 6 |
|  | inherent viscosity | 1.04 | 0.82 | 0.87 | 0.60 |
|  | solid content (wt %) | 16.7 | 16.1 | 16.2 | 16.5 |
|  | solution viscosity (Pa · s) | 27.2 | 30.2 | 107.5 | 8.7 |
| Properties of substrate for flexible devices |  |  |  |  |  |
|  | state observation | ○ | ○ | ○ | ○ |
|  | tensile elastic modulus (GPa) | 5.7 | 5.4 | 5.5 | 6.1 |
|  | tensile elongation at break (%) | 18 | 30 | 24 | 15 |
|  | tensile strength at break (MPa) | 175 | 164 | 150 | 185 |

INDUSTRIAL APPLICABILITY

According to the present invention, there may be provided a method for easily producing an aqueous polyimide precursor solution composition, which has higher environmental acceptability, without the need for a solvent other than water. According to the production method, an aqueous polyimide precursor solution composition having an extremely low organic solvent content, particularly an aqueous polyimide precursor solution composition comprising an aqueous solvent which contains no organic solvent, may be very easily (directly) produced.

According to the present invention, there may be provided an aqueous polyimide precursor solution composition which comprises an aqueous solvent and has good environmental acceptability, and may provide a polyimide having excellent properties such as flexibility, heat resistance, mechanical strength, electrical properties, and solvent resistance, and preferably comprises a polyimide precursor having a high molecular weight and a solvent containing no organic solvent other than water.

According to the present invention, there may be provided a method for producing a polyimide seamless belt using an aqueous polyimide precursor solution composition which comprises an aqueous solvent and has good environmental acceptability. Moreover, the seamless belt of the polyimide which is obtained according to the production method of the present invention may have excellent properties such as flexibility, heat resistance, mechanical strength, electrical properties, and solvent resistance, and therefore may be suitably used as an intermediate transfer seamless belt or a fixing seamless belt of an electrophotographic device.

According to the present invention, there may be also provided a binder resin composition for electrodes which comprises an aqueous solvent and has good environmental acceptability. Moreover, the polyimide obtained from the binder resin composition for electrodes may have excellent properties such as flexibility, heat resistance, mechanical strength, electrical properties, and solvent resistance, and have a low degree of swelling in a battery environment, and have excellent toughness.

According to the present invention, there may be also provided a polyimide precursor resin composition for flexible device substrates, which comprises an aqueous solvent and has good environmental acceptability. Moreover, the polyimide substrate for flexible device which is obtained according to the present invention may have excellent properties such as flexibility, heat resistance, mechanical strength, electrical properties, and solvent resistance, and therefore may be suitably used, for example, as a substrate for flexible device which is a display device such as substrates for a liquid crystal display, an organic EL display and an electronic paper, and as a substrate for flexible device which is a light-receiving device such as a substrate for a thin-film solar cell.

What is claimed is:

1. A method for producing an aqueous polyimide precursor solution composition, comprising:

reacting a tetracarboxylic acid component and a diamine component in water containing no organic solvent in a presence of an imidazole to form a polyamic acid comprising a repeating unit represented by the following formula (1), wherein, the polyamic acid and the imidazole are dissolved in the water, an amount of the imidazole is 1.6 mole or more per mole of the tetracarboxylic acid component, the tetracarboxylic acid component comprises at least one selected from the group consisting of an aromatic tetracarboxylic dianhydride containing no fluorine group, an aliphatic tetracarboxylic dianhydride, and an aromatic tetracarboxylic dianhydride containing a fluorine group; the aromatic tetracarboxylic dianhydride containing no fluorine group being selected from the group consisting of 3,3',4,4'-biphenyltetracarboxylic dianhydride, 2,3,3',4'-biphenyltetracarboxylic dianhydride, 2,2',3,3'-biphenyltetracarboxylic dianhydride, 4,4'-oxydiphthalic dianhydride, diphenylsulfone tetracarboxylic dianhydride, p-terphenyl tetracarboxylic dianhydride, and m-terphenyl tetracarboxylic dianhydride, and the diamine component comprises at least one selected from the group consisting of an aromatic diamine containing no fluorine group and having a solubility in water at 25° C. of 0.1 g/L or more, and an aromatic diamine containing a fluorine group, and wherein, more than 50 mol % of the tetracarboxylic acid component is the aromatic tetracarboxylic dianhydride containing no fluorine group, and less than 50 mol %, including 0 mol %, of the tetracarboxylic acid component is the aliphatic tetracarboxylic dianhydride, and/or the aromatic tetracarboxylic dianhydride containing a fluorine group, and more than 50 mol % of the diamine component is the aromatic diamine containing no fluorine group and having a solubility in water at 25° C. of 0.1 g/L or more, and less than 50 mol %, including 0 mol %, of the diamine component is the aromatic diamine containing a fluorine group, and a combination of only the aromatic tetracarboxylic dianhydride containing no fluorine group, and only the aromatic diamine containing no fluorine group is excluded,

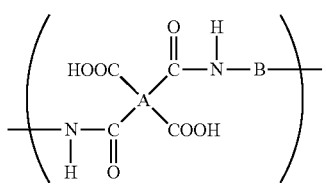

Formula (1)

wherein

A represents a tetravalent group derived from the tetracarboxylic acid component and B represents a divalent group derived from the diamine component.

2. The method for producing an aqueous polyimide precursor solution composition as claimed in claim 1, wherein the imidazole is selected from the group consisting of 1,2-dimethylimidazole, 2-ethyl-4-methylimidazole, 4-ethyl-2-methylimidazole, and 1-methyl-4-ethylimidazole.

3. The method for producing an aqueous polyimide precursor solution composition as claimed in claim 1, wherein the aqueous polyimide precursor solution composition has an inherent viscosity of 0.4 or more.

4. A method for producing an electrode, comprising: producing the aqueous polyimide precursor solution composition according to the method of claim 1; and mixing the aqueous polyimide precursor solution composition and at least an electrode active material to form an electrode mixture paste, applying the electrode mixture paste onto a current collector, and heating the electrode mixture paste to remove a solvent and effect imidization.

5. A method for producing a flexible device which is a display device or a light-receiving device, comprising: producing the aqueous polyimide precursor solution composition according to the method of claim 1; and applying the aqueous polyimide precursor solution composition onto a carrier substrate, and then heating the composition to form a solid polyimide resin film;

forming a circuit on the polyimide resin film; and separating the polyimide resin film on which the circuit is formed from the carrier substrate.

6. A method for producing an aqueous polyimide precursor solution composition, comprising:

reacting a tetracarboxylic acid component and a diamine component in water containing no organic solvent in a presence of an imidazole at 50° C. or higher and 100° C. or lower to form a polyamic acid comprising a repeating unit represented by the following formula (1), wherein, the polyamic acid and the imidazole are dissolved in the water, an amount of the imidazole is 1.6 mole or more per mole of the tetracarboxylic acid component, the tetracarboxylic acid component comprises at least one selected from the group consisting of an aromatic tetracarboxylic dianhydride containing no fluorine group, an aliphatic tetracarboxylic dianhydride, and an aromatic tetracarboxylic dianhydride containing a fluorine group, and the diamine component comprises at least one selected from the group consisting of an aromatic diamine containing no fluorine group and having a solubility in water at 25° C. of 0.1 g/L or more, and an aromatic diamine containing a fluorine group, and wherein, more than 50 mol % of the tetracarboxylic acid component is the aromatic tetracarboxylic dianhydride containing no fluorine group, and less than 50 mol %, including 0 mol %, of the tetracarboxylic acid component is the aliphatic tetracarboxylic dianhydride, and/or the aromatic tetracarboxylic dianhydride containing a fluorine group, and more than 50 mol % of the diamine component is the aromatic diamine containing no fluorine group and having a solubility in water at 25° C. of 0.1 g/L or more, and less than 50 mol %, including 0 mol %, of the diamine component is the aromatic diamine containing a fluorine group, and a combination of only the aromatic tetracarboxylic dianhydride containing no fluorine group, and only the aromatic diamine containing no fluorine group is excluded,

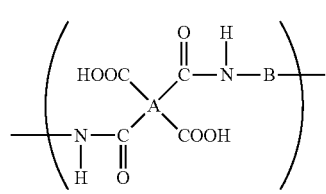

Formula (1)

wherein
A represents a tetravalent group derived from the tetracarboxylic acid component and B represents a divalent group derived from the diamine component.

* * * * *